US008519271B2

(12) United States Patent
Oikawa et al.

(10) Patent No.: US 8,519,271 B2
(45) Date of Patent: Aug. 27, 2013

(54) FLEXIBLE PRINTED CIRCUIT, TOUCH PANEL, DISPLAY PANEL AND DISPLAY

(75) Inventors: Harutoshi Oikawa, Miyagi (JP); Kiyohiro Kimura, Miyagi (JP)

(73) Assignee: Sony Corporation, Tokyo (JP)

( * ) Notice: Subject to any disclaimer, the term of this patent is extended or adjusted under 35 U.S.C. 154(b) by 1107 days.

(21) Appl. No.: 12/485,615

(22) Filed: Jun. 16, 2009

(65) Prior Publication Data
US 2009/0315855 A1 Dec. 24, 2009

(30) Foreign Application Priority Data

Jun. 18, 2008 (JP) ................................. 2008-159298

(51) Int. Cl.
*H05K 1/00* (2006.01)

(52) U.S. Cl.
USPC ............................ 174/254; 174/250; 174/261

(58) Field of Classification Search
USPC ................. 361/749, 750, 751; 174/254, 250, 174/255, 261; 439/67, 77; 345/173
See application file for complete search history.

(56) References Cited

U.S. PATENT DOCUMENTS

| 5,001,308 | A | * | 3/1991 | Mori | 200/5 A |
|---|---|---|---|---|---|
| 5,844,175 | A | * | 12/1998 | Nakanishi et al. | 178/18.03 |
| 5,869,791 | A | * | 2/1999 | Young | 178/20.01 |
| 6,304,251 | B1 | * | 10/2001 | Ito et al. | 345/173 |
| 7,202,855 | B2 | * | 4/2007 | Shigetaka et al. | 345/173 |
| 7,439,466 | B2 | * | 10/2008 | Yamaue et al. | 200/512 |
| 7,455,529 | B2 | * | 11/2008 | Fujii et al. | 439/67 |
| 7,538,288 | B1 | * | 5/2009 | Huang | 200/512 |
| 2004/0051699 | A1 | * | 3/2004 | Tanabe et al. | 345/173 |

FOREIGN PATENT DOCUMENTS

| JP | 2002-182854 | 6/2002 |
|---|---|---|
| JP | 2003-008162 | 1/2003 |
| JP | 2004-063690 | 2/2004 |
| JP | 2005-317912 | 11/2005 |

OTHER PUBLICATIONS

Japanese Office Action issued on Apr. 10, 2012, in connection with counterpart JP Application No. 2008-159298.

* cited by examiner

*Primary Examiner* — Hoa C Nguyen
*Assistant Examiner* — Dimary Lopez
(74) *Attorney, Agent, or Firm* — Dentons US LLP

(57) ABSTRACT

A flexible printed circuit includes: a flexible substrate extending from a first end section to a second end section, and having an opening or a notch in proximity to the first end section; a first wiring layer extending from the first end section to the second end section so as to avoid the opening or the notch; a second wiring layer extending from the first end section to the second end section so as to block the opening or the notch; a first conductive member being formed opposed to the flexible substrate in relation to the first wiring layer and at least in proximity to the first end section in a region opposed to the first wiring layer, and being electrically connected to the first wiring layer; and a second conductive member electrically connected to the second wiring layer via the opening or the notch.

7 Claims, 38 Drawing Sheets

FLEXIBLE PRINTED CIRCUIT, TOUCH PANEL, DISPLAY PANEL AND DISPLAY

BACKGROUND OF THE INVENTION

1. Field of the Invention

The present invention relates to a flexible printed circuit performing signal transmission from one device to another device, and a touch panel, a display panel and a display each of which includes the flexible printed circuit.

2. Description of the Related Art

Techniques of detecting a position touched by an object to be detected such as a finger or a pen on a display surface of a display have been heretofore known. Among them, a typical and widespread technique is a display including a touch panel. There are various types of touch panels, but a resistive touch panel is commonly used. In the resistive touch panel, a panel surface has a laminate configuration in which a very small spacer is sandwiched between glass and a film opposed to each other, and a transparent electrode grids are arranged on opposed surfaces of the glass and the film. Then, when a finger or a pen touches a surface of the film, the film is bent, and a transparent electrode on the surface of the film and a transparent electrode on the surface of the glass are brought into contact with each other, so that a current flows. Thereby, the position of the finger or the pen is detected by measuring a partial pressure ratio between the resistance of the transparent electrode on the surface of the glass and the resistance of the transparent electrode on the surface of the film. Therefore, when such a touch panel is used, users intuitively operate the touch panel.

FIG. 62 illustrates an example of a sectional configuration of the above-described resistive touch panel. A touch panel 100 illustrated in FIG. 62 includes a pair of transparent substrates 200 and 300 which are opposed to each other with a predetermined space in between, resistive films (not illustrated) arranged on opposed surfaces of the pair of transparent substrates 200 and 300, connection terminals 210 and 310 electrically connected to the resistive films, respectively, a flexible printed circuit (FPC) 400 electrically connected to the connection terminals 210 and 310, and an adhesive layer (not illustrated) bonding the transparent substrates 200 and 400 together with the FPC 400 in between.

Four connection terminals 210 are arranged on a surface where the resistive film is arranged of the transparent substrate 200 at regular intervals, and are bonded and connected to an anisotropic conductive film 410 (which will be described later) arranged on one surface of the FPC 400. Moreover, two (in FIG. 62, the second and the fourth connection terminals 210 from the left) of the four connection terminals 210 are connected to an end of the resistive film on the transparent substrate 200, and the other two (in FIG. 62, the first and the third connection terminals 210 from the left) of the four connection terminals 210 are so-called dummy terminals, and they are arranged so as to keep a constant space between the transparent substrate 200 and the anisotropic conductive film 410 of the FPC 400.

Four connection terminals 310 are arranged on a surface where the resistive film is arranged of the transparent substrate 300 at regular intervals, and are bonded and connected to the anisotropic conductive film 410 arranged on the other surface of the FPC 400. Moreover, two (in FIG. 62, the second and the fourth connection terminals 310 from the left) of the four connection terminals 310 are connected to an end of the resistive film on the transparent substrate 300, and the other two (in FIG. 62, the first and the third connection terminals 310 from the left) of the four connection terminals 310 are so-called dummy terminals, and they are arranged so as to keep a constant space between the transparent substrate 300 and the anisotropic conductive film 410 of the FPC 400.

As illustrated in FIGS. 63 to 66, the FPC 400 has a strip shape extending in one direction. FIG. 63 illustrates a schematic configuration of one surface of an end of the FPC 400, and FIG. 64 illustrates a schematic configuration of the other side of FIG. 63. FIGS. 65 and 66 illustrate sectional views taken along lines A-A and B-B, respectively, in the direction of arrows in FIG. 63. An end of the FPC 400 is sandwiched between the pair of transparent substrates 200 and 300, and the other end of the FPC 400 is connected to a device (not illustrated) processing an output signal from the touch panel 100. The FPC 400 includes a flexible base film 420 extending in a direction where the FPC 400 extends. An end section of the base film 420 is sandwiched between the pair of transparent substrates 200 and 300.

Four pairs of wiring layers 430 and 440 are arranged so as to be opposed to each other with the end section (hereinafter referred to as transparent substrate-side end section) sandwiched between the pair of transparent substrates 200 and 300 of the base film 420 in between. The wiring layers 430 on a side close to the transparent substrate 200 are transparent substrate-side end section, and four wiring layers 430 are formed in an island shape in regions opposed to the connection terminals 210. On the other hand, four wiring layers 440 on a side close to the transparent substrate 300 are formed linearly from regions opposed to the connection terminals 310 to an end section opposite to the transparent substrate-side end section of the base film 420.

Plating layers 450 are arranged at least on surfaces on a side close to the transparent substrate-side end section of the wiring layers 430 and 440. Two through holes 460 penetrating through the base film 420 are arranged in the transparent substrate-side end section of the base film 420. The two through holes 460 penetrate through two pairs (in FIG. 62, the second and the fourth pairs from the left) of wiring layers 430 and 440, respectively, from among the four pairs of wiring layers 430 and 440, and the plating layers 450 arranged in contact with the wiring layers 430 and 440 through which the through holes 460 penetrate are integrally formed. Thereby, the wiring layers 430 and 440 in each of the two pairs (in FIG. 62, the second and the fourth pairs from the left) from among the four pairs of wiring layers 430 and 440 are electrically connected to each other via the through holes 460.

In addition, the wiring layers 430 and 440 in each of the other two pairs (in FIG. 62, the first and the third pairs from the left) through which the through holes 460 do not penetrate from among the four pairs of wiring layers 430 and 440 are electrically separated from each other. Therefore, the wiring layers 430 through which the through hole 460 do not penetrate (in FIG. 62, the first and the third wiring layers 430) from among the four wiring layers 430 are so-called dummy wiring layers, and are arranged so as to keep a constant space between the base film 420 and the anisotropic conductive film 410.

Plating layers 470 are further arranged on surfaces of the plating layers 450. The plating layers 470 on a side close to the transparent substrate 200 are coupled to the anisotropic conductive film 410 formed on a surface of the transparent substrate 200, and the plating layers 470 on a side close to the transparent substrate 300 are coupled to the anisotropic conductive film 410 formed on a surface of the transparent substrate 300. Therefore, in the touch panel 100, two connection terminals 210 (in FIG. 62, the second and the fourth connection terminals 210 from the left) coupled to the resistive film on a side close to the transparent substrate 200 are electrically connected to two wiring layers 440 (in FIG. 62, the second and the fourth wiring layers 440 from the left) via the through holes 460, and two connection terminals 310 (in FIG. 62, the first and the third connection terminals 310 from the left) coupled to the resistive film on a side close to the transparent substrate 300 are electrically connected to two wiring layers 440 (in FIG. 62, the first and the third wiring layer 440 from the left) not via the through holes 460 but via the plating layers 450 and 470.

Moreover, as illustrated in FIGS. 62 to 63, in the FPC 400, a coverlay 490 which protects the wiring layers 440 and the plating layers 450 from outside is bonded to a surface on a side close to the wiring layer 440 of the FPC 400 by an adhesive layer 480.

A typical configuration of the resistive touch panel is described in, for example, Japanese Unexamined Patent Application Publication No. 2002-182854 or the like.

SUMMARY OF THE INVENTION

In the FPC 400 exemplified in FIG. 62, a large number of layers are laminated, so the FPC 400 tends to have a larger thickness. However, when the FPC 400 has a too large thickness, the adhesive layer bonding the transparent substrates 200 and 300 together is easily peeled, so it is difficult to have a narrower frame by reducing the width of the adhesive layer. Moreover, when the FPC 400 has a large thickness, a device equipped with the FPC 400 also has a large thickness. Thereby, the FPC 400 is an impediment to reduction in the thickness of the device.

It is desirable to provide a flexible printed circuit having a smaller thickness than ever before, and a touch panel, a display panel and a display each of which includes the flexible printed circuit.

According to an embodiment of the invention, there is provided a flexible printed circuit including: a flexible substrate including a first end section and a second end section, extending from the first end section to the second end section and having an opening or a notch near the first end section. The flexible printed circuit includes a first wiring layer, a second wiring layer, a first conductive member and a second conductive member. The first wiring layer is in contact with one surface of the flexible substrate, and extends from the first end section to the second end section so as to avoid the opening or the notch. The second wiring layer is in contact with the surface where the first wiring layer is in contact of the flexible substrate, and extends from the first end section to the second end section so as to block the opening or the notch. The first conductive member is formed opposed to the flexible substrate in relation to the first wiring layer and at least in proximity to the first end section in a region opposed to the first wiring layer, and is electrically connected to the first wiring layer. The second conductive member is formed opposed to the first conductive member in relation to the flexible substrate and at least in proximity to the first end section in a region opposed to the second wiring layer, and is electrically connected to the second wiring layer via the opening or the notch.

According to an embodiment of the invention, there is provided a touch panel including: a first transparent substrate and a second transparent substrate arranged so as to be opposed to each other with a space in between. A first connection terminal is arranged on a surface opposed to the second transparent substrate of the first transparent substrate, and a second connection terminal is arranged on a surface opposed to the first transparent substrate of the second transparent substrate. A flexible printed circuit is included in a space between the first transparent substrate and the second transparent substrate and in a region including regions opposed to the first connection terminal and the second connection terminal. The flexible printed circuit includes a flexible substrate including a first end section sandwiched between the first transparent substrate and the second transparent substrate and a second end section, extending from the first end section to the second end section, and having an opening or a notch in proximity to the first end section. The flexible printed circuit includes a first wiring layer, a second wiring layer, a first conductive member and a second conductive member. The first wiring layer is in contact with one surface of the flexible substrate, and extends from the first end section to the second end section so as to avoid the opening or the notch. The second wiring layer is in contact with the surface where the first wiring layer is in contact of the flexible substrate, and extends from the first end section to the second end section so as to block the opening or the notch. The first conductive member is formed opposed to the flexible substrate in relation to the first wiring layer and at least in proximity to the first end section in a region opposed to the first wiring layer, and is electrically connected to the first wiring layer and the first connection terminal. The second conductive member is formed opposed to the first conductive member in relation to the flexible substrate and at least in proximity to the first end section in a region opposed to the second wiring layer, and is electrically connected to the second wiring layer and the second connection terminal via the opening or the notch.

According to an embodiment of the invention, there is provided a display panel including: a pixel substrate including a pixel region where pixel circuits are formed in a matrix form and a terminal region where connection terminals connected to the pixel circuits, respectively, are formed around the pixel region; and a flexible printed circuit fixed to the pixel substrate. The flexible printed circuit includes a flexible substrate including a first end section fixed to the pixel substrate and a second end section, extending from the first end section to the second end section, and having an opening or a notch in proximity to the first end section. The flexible printed circuit includes a first wiring layer, a second wiring layer, a first conductive member and a second conductive member. The first wiring layer is in contact with one surface of the flexible substrate, and extends from the first end section to the second end section so as to avoid the opening or the notch. The second wiring layer is in contact with the surface where the first wiring layer is in contact of the flexible substrate, and extends from the first end section to the second end section so as to block the opening or the notch. The first conductive member is formed opposed to the flexible substrate in relation to the first wiring layer and at least in proximity to the first end section in a region opposed to the first wiring layer, and is electrically connected to the first wiring layer. The second conductive member is formed opposed to the first conductive member in relation to the flexible substrate and at least in proximity to the first end section in a region opposed to the second wiring layer, and is electrically connected to the second wiring layer via the opening or the notch.

According to an embodiment of the invention, there is provided a first display including: a display panel including an image display surface; and a touch panel arranged on the image display surface. The touch panel includes a first transparent substrate and a second transparent substrate arranged so as to be opposed to each other with a space in between. A first connection terminal is arranged on a surface opposed to the second transparent substrate of the first transparent substrate, and a second connection terminal is arranged on a surface opposed to the first transparent substrate of the second transparent substrate. A flexible printed circuit is included in a space between the first transparent substrate and the second transparent substrate and in a region including regions opposed to the first connection terminal and the second connection terminal. The flexible printed circuit includes a flexible substrate including a first end section sandwiched between the first transparent substrate and the second transparent substrate and a second end section, extending from the first end section to the second end section, and having an opening or a notch in proximity to the first end section. The flexible printed circuit includes a first wiring layer, a second wiring layer, a first conductive member and a second conductive member. The first wiring layer is in contact with one surface of the flexible substrate, and extends from the first end section to the second end section so as to avoid the opening or the notch. The second wiring layer is in contact with the surface where the first wiring layer is in contact of the flexible substrate, and extends from the first end section to the second end section so as to block the opening or the notch. The first conductive member is formed opposed to the flexible substrate in relation to the first wiring layer and at least in proximity to the first end section in a region opposed to the first wiring layer, and is electrically connected to the first wiring layer and the first connection terminal. The second conductive member is formed opposed to the first conductive member in relation to the flexible substrate and at least in proximity to the first end section in a region opposed to the second wiring layer, and is electrically connected to the second wiring layer and the second connection terminal via the opening or the notch.

According to an embodiment of the invention, there is provided a second display including: a display panel including an image display surface. The display panel includes a pixel substrate including a pixel region where pixel circuits are formed in a matrix form corresponding to the image display surface and a terminal region where connection terminals connected to the pixel circuits, respectively, are formed around the pixel region. The flexible printed circuit includes a flexible substrate including a first end section fixed to the pixel substrate and a second end section, extending from the first end section to the second end section, and having an opening or a notch in proximity to the first end section. The flexible printed circuit includes a first wiring layer, a second wiring layer, a first conductive member and a second conductive member. The first wiring layer is in contact with one surface of the flexible substrate, and extends from the first end section to the second end section so as to avoid the opening or the notch. The second wiring layer is in contact with the surface where the first wiring layer is in contact of the flexible substrate, and extends from the first end section to the second end section so as to block the opening or the notch. The first conductive member is formed opposed to the flexible substrate in relation to the first wiring layer and at least in proximity to the first end section in a region opposed to the first wiring layer, and is electrically connected to the first wiring layer. The second conductive member is formed opposed to the first conductive member in relation to the flexible substrate and at least in proximity to the first end section in a region opposed to the second wiring layer, and is electrically connected to the second wiring layer via the opening or the notch.

In the flexible printed circuit, the touch panel, the display panel, the first display and the second display according to the embodiment of the invention, the wiring layers (the first wiring layer and the second wiring layer) are arranged in contact with only one surface of the flexible substrate. Moreover, the first conductive member arranged on one surface of the flexible substrate is electrically connected to the first wiring layer arranged on the one surface of the flexible substrate. On the other hand, the second conductive member arranged on the other surface of the flexible substrate is electrically connected to the second wiring layer arranged on the one surface of the flexible substrate via the opening or the notch arranged in the flexible substrate. Thus, in the embodiment of the invention, the opening or the notch is arranged in the flexible substrate without arranging the wiring layers on both surfaces of the flexible substrate or further arranging a through hole and through hole plating, so that the second conductive member arranged on the other surface of the flexible substrate is electrically connected to the second wiring layer arranged on the one surface of the flexible substrate.

In the flexible printed circuit, the touch panel, the display panel, the first display and the second display according to the embodiment of the invention, the opening or the notch is arranged in the flexible substrate without arranging the wiring layers on both surfaces of the flexible substrate or further arranging a through hole and through hole plating, so that the second conductive member arranged on the other surface of the flexible substrate is electrically connected to the second wiring layer arranged on the one surface of the flexible substrate. Therefore, the thickness of the flexible printed circuit is reduced by the total thickness of one wiring layer and the through hole plating. Thereby, a flexible printed circuit with a smaller thickness than ever before is achieved. As a result, a narrower frame and a reduction in the thickness of a device may be achieved.

Other and further objects, features and advantages of the invention will appear more fully from the following description.

DETAILED DESCRIPTION OF THE PREFERRED EMBODIMENTS

Preferred embodiments will be described in detail below referring to the accompanying drawings.

First Embodiment

Figure 1:
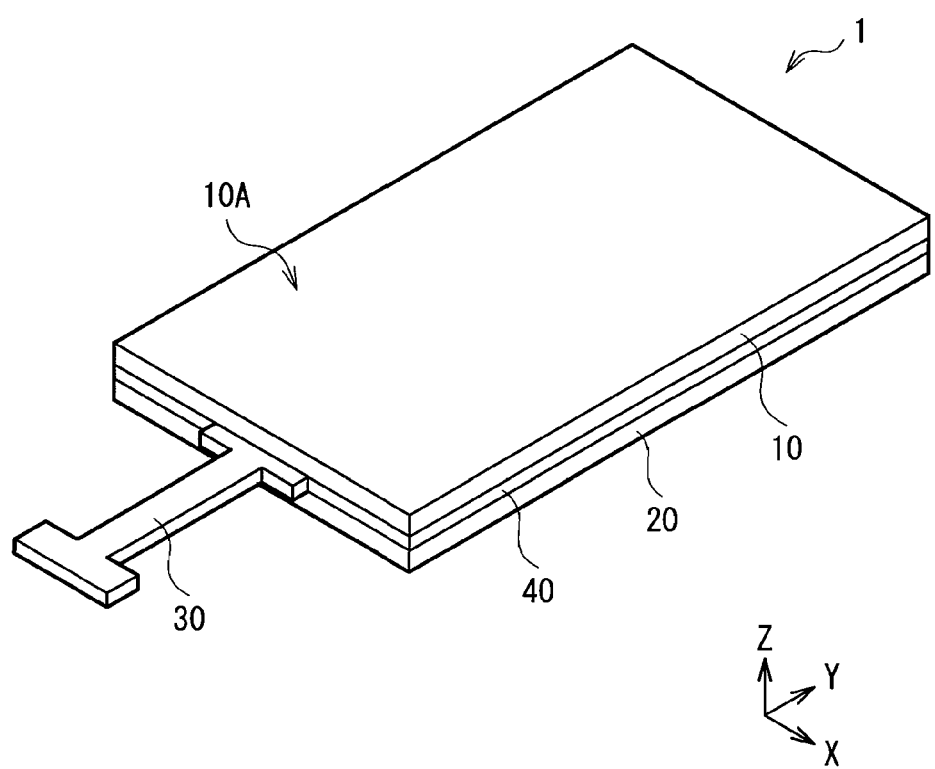
FIG. 1 is a perspective view of a touch panel according to a first embodiment of the invention.
Figure 2:
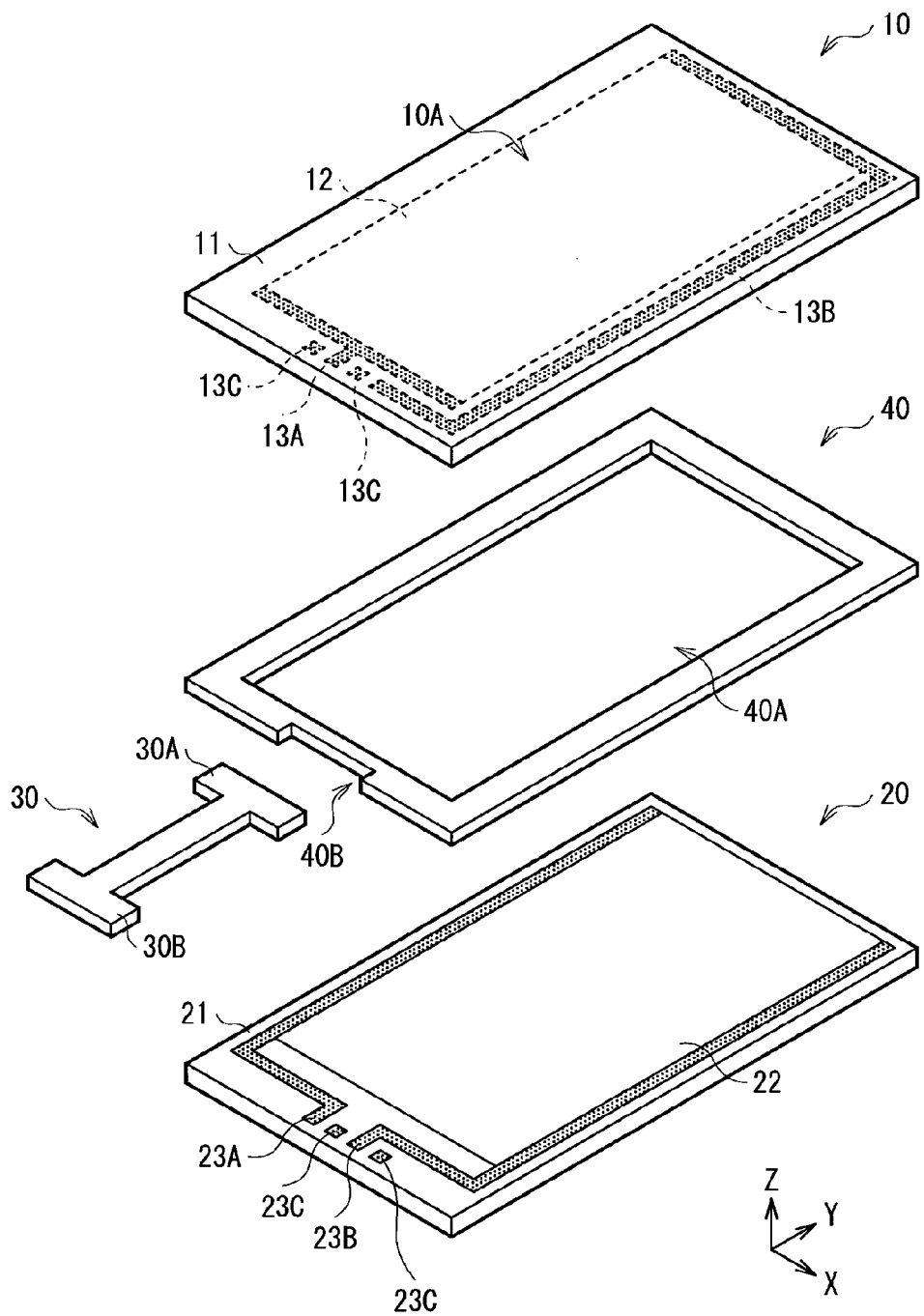
FIG. 2 is an exploded view of the touch panel in FIG. 1.

FIG. 1 illustrates a perspective view of a schematic configuration of a touch panel 1 according to a first embodiment of the invention. FIG. 2 illustrates an exploded view of the touch panel 1 in FIG. 1. The touch panel 1 according to the embodiment is laid over, for example, a display including a liquid crystal panel, an organic EL panel or the like to be used as a screen input display, and when a surface of the touch panel 1 is pressed with a finger, a pen or the like, selections for display on a display screen of the display is directly made. Kinds of touch panels include a resistive touch panel, a capacitive touch panel and the like. In the embodiment, the case where the present invention is applied to the resistive touch panel will be described as an example.

The touch panel 1 includes, for example, a pair of an upper substrate 10 and a lower substrate with a predetermined space in between. A flexible printed circuit (FPC) 30 and an adhesive layer 40 are arranged between the pair of the upper substrate 10 and the lower substrate 20.

The upper substrate 10 includes a transparent substrate 11 (a second transparent substrate) as a contact surface 10A which a finger, a pen or the like touches. A resistive film 12 is arranged on a surface (a lower surface) opposite to the contact surface 10A of the transparent substrate 11. Connection terminals 13A and 13B (second connection terminals) coupled and electrically connected to the resistive film 12 are arranged around the resistive film 12 on the lower surface of the transparent substrate 11. As illustrated in an enlarged view in FIG. 3, an end of each of the connection terminals 13A and 13B is arranged at one edge of the lower surface of the transparent substrate 11 in a region opposed to an end section 30A (a transparent substrate-side end section) of the FPC 30, and the ends of the connection terminals 13A and 13B are in contact with an anisotropic conductive film 36 (which will be described later) of the PFC 30. Moreover, two dummy terminals 13C are arranged on the lower surface of the transparent substrate 11. The dummy terminals 13C are provided to keep a constant space between the transparent substrate 11 and the anisotropic conductive film 36 of the FPC 30. The dummy terminals 13C may not be arranged, if necessary.

In this case, the transparent substrate 11 is made of, for example, a flexible transparent resin such as soft polyethylene terephthalate (PET). The resistive film 12 is made of, for example, indium tin oxide (ITO) or the like. The connection terminals 13A and 13B and the dummy terminals 13C are made of, for example, silver (Ag) or the like.

The lower substrate 20 includes a transparent substrate 21 (a first transparent substrate) supporting a resistive film 22 (which will be described later) where the resistive film 12 comes into contact when a finger, a pen or the like touches the upper substrate 10. The above-described resistive film 22 is arranged in a region opposed to the resistive film 12 on a surface (an upper surface) opposed to the upper substrate of the transparent substrate 21, and connection terminals 23A and 23B (first connection terminals) coupled to the resistive film 22 are arranged around the resistive film 22 on the upper surface of the transparent substrate 21. An end of each of the connection terminals 23A and 23B is arranged at one edge of the upper surface of the transparent substrate 21 in a region opposed to the FPC 30, and the ends of the connection terminals 23A and 23B are in contact with an anisotropic conductive film 35 (which will be described later) of the FPC 30. Two dummy terminals 23C are further arranged on the upper surface of the transparent substrate 21. The dummy terminals 23C are provided to keep a constant space between the transparent substrate 21 and the anisotropic conductive film 35 of the FPC 30. The dummy terminals 23C may not be arranged, if necessary.

In this case, the transparent substrate 21 is made of, for example, a flexible transparent resin such as soft polyethylene terephthalate (PET), a hard transparent resin such as an acrylic sheet, hard transparent glass, or the like. The resistive film 22 is made of, for example, indium tin oxide (ITO) or the like. The connection terminals 23A and 23B and the dummy terminals 23C are made of, for example, silver (Ag) or the like.

The adhesive layer 40 has a ring shape having an opening 40A in a region opposed to the resistive film 12, and bonds the transparent substrates 11 and 21 together with the FPC 30 in between. The adhesive layer 40 has a notch 40B in a region opposed to the FPC 30 so as not to overlap the FPC 30 in a thickness direction. The adhesive layer 40 is made of, for example, a double-faced tape or the like.

Figure 3:
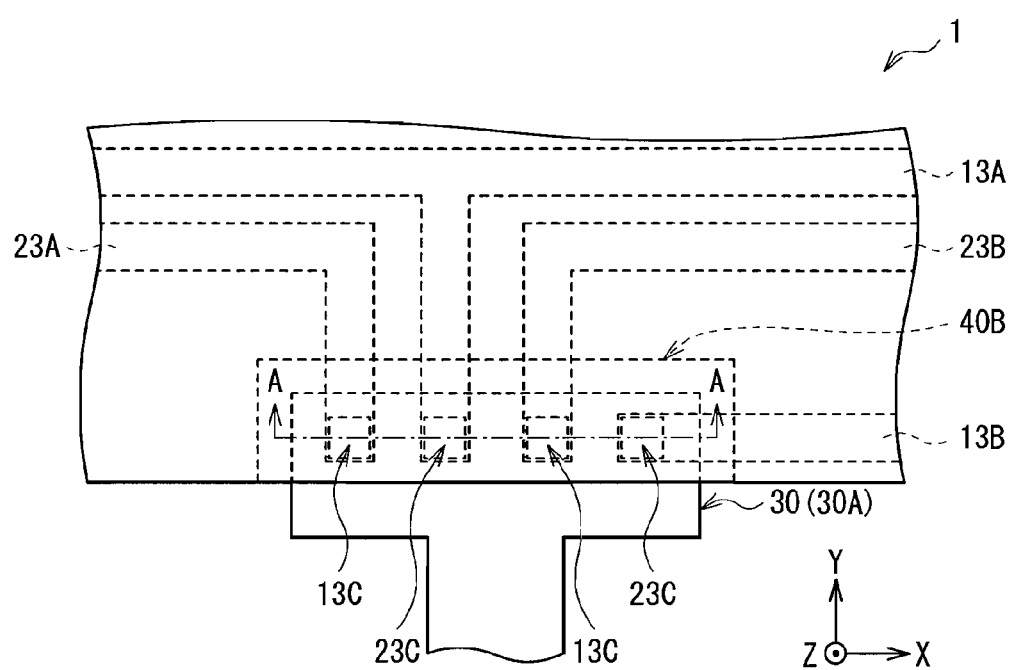
FIG. 3 is an enlarged view of a part of the touch panel in FIG. 1.
Figure 4:
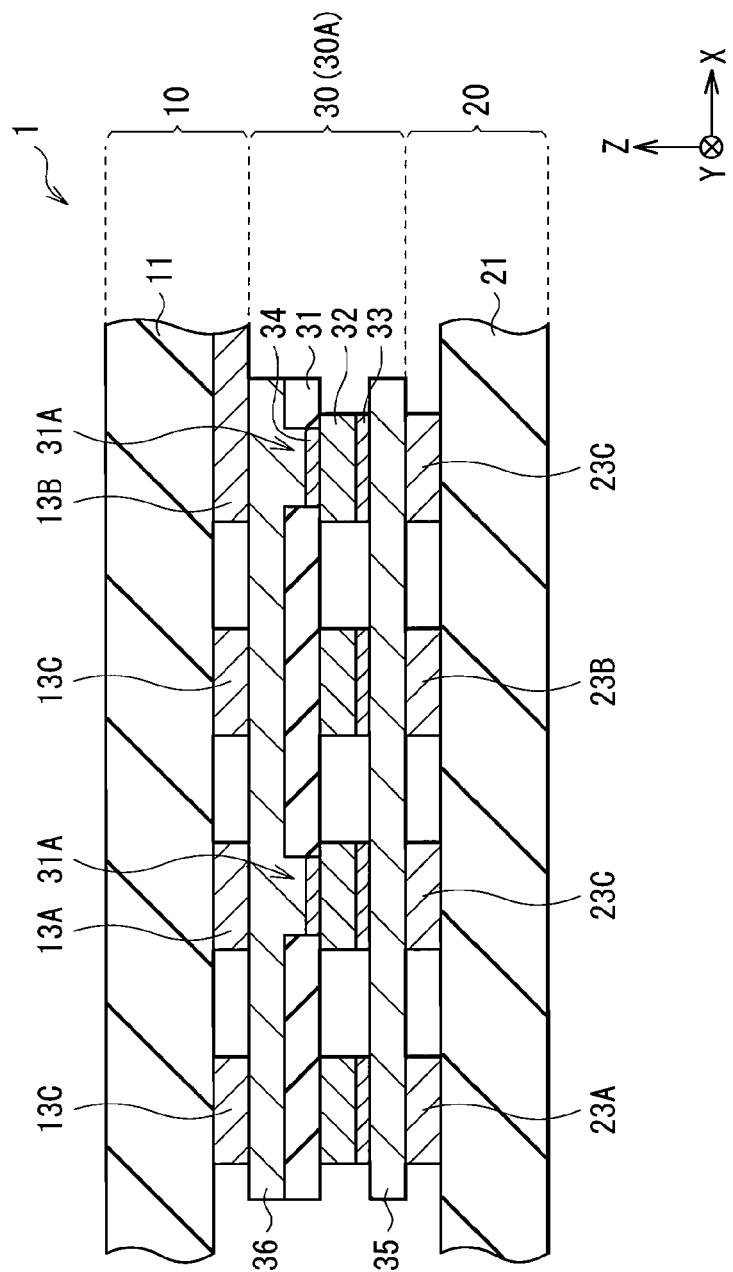
FIG. 4 is a sectional view of the touch panel taken along line A-A in the direction of arrows in FIG. 3.
Figure 5:
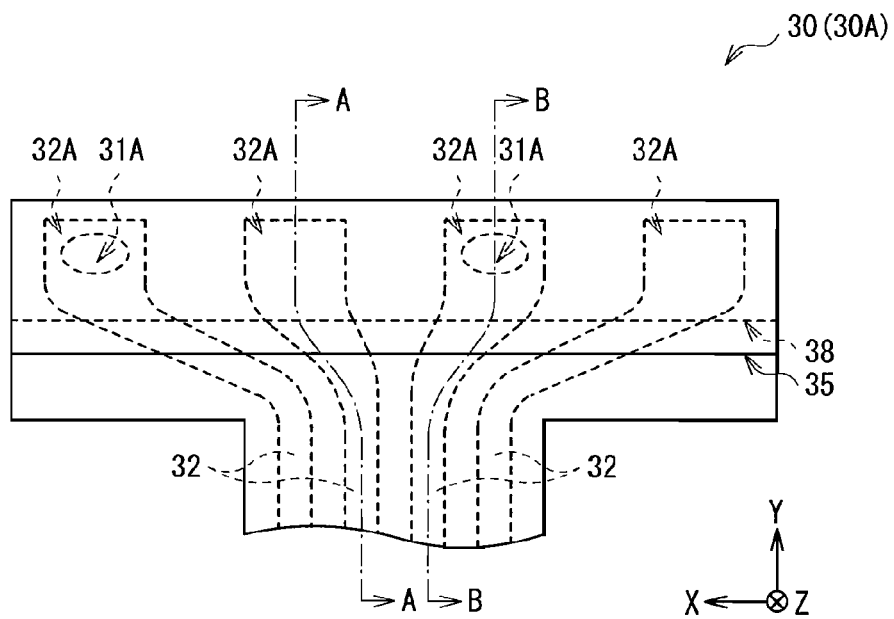
FIG. 5 is a plan view of one surface of one end section of an FPC in FIG. 1.
Figure 6:
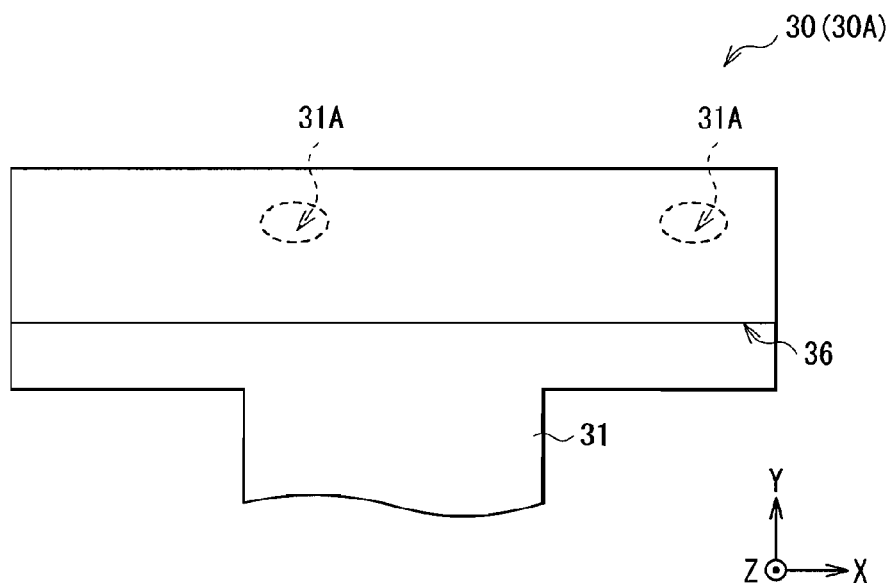
FIG. 6 is a plan view of the other surface of the one end section of the FPC in FIG. 1.
Figure 7:
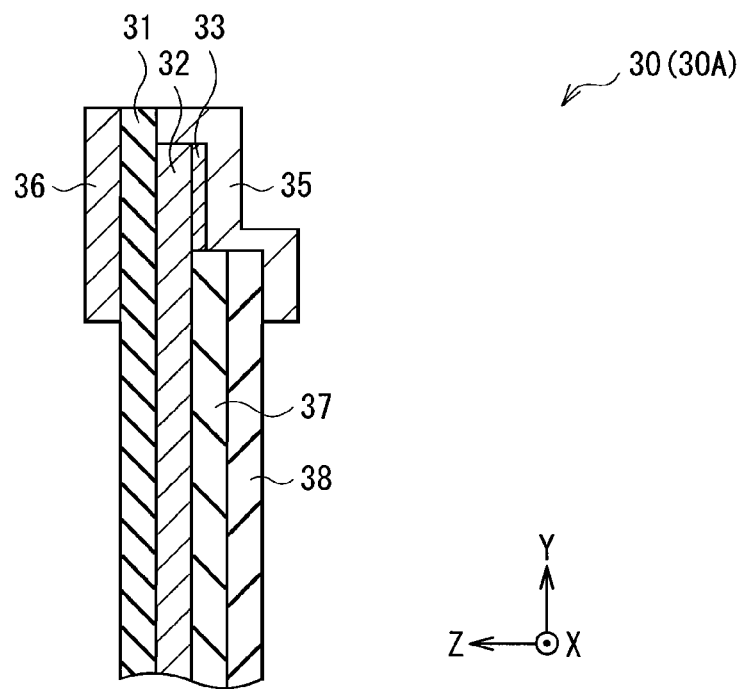
FIG. 7 is a sectional view of the FPC taken along line A-A in the direction of arrows in FIG. 5.
Figure 8:
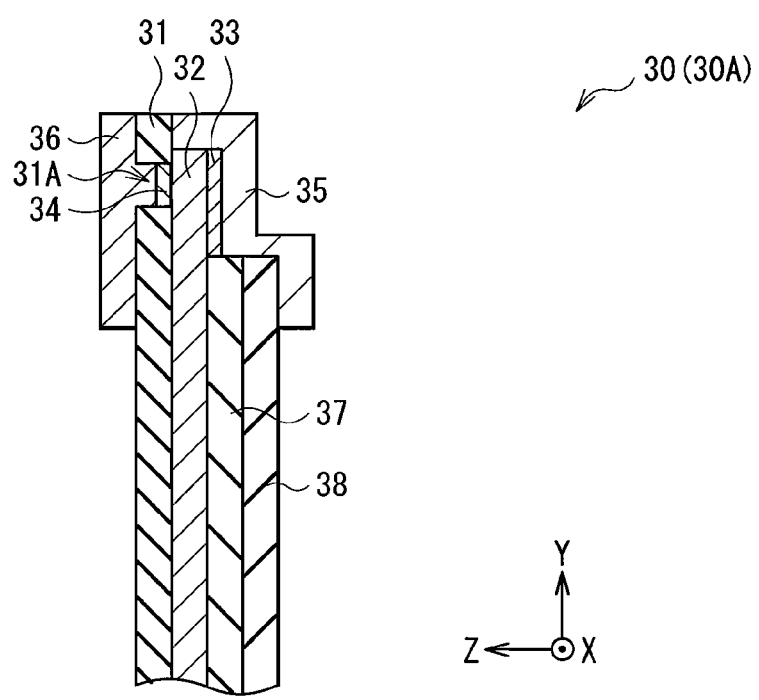
FIG. 8 is a sectional view of the FPC taken along line B-B in the direction of arrows in FIG. 5.
Figure 9:
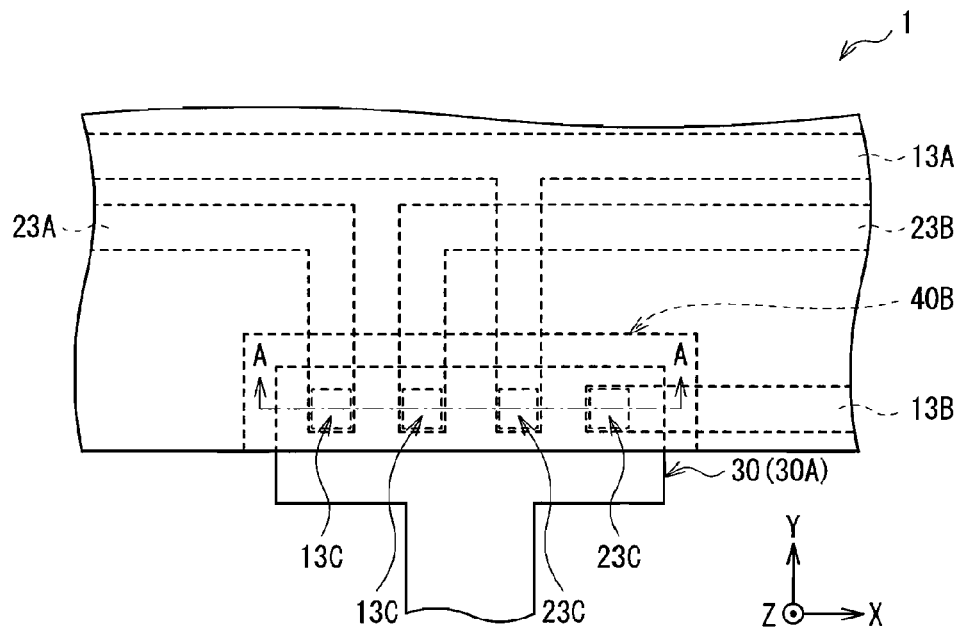
FIG. 9 is an enlarged view of a part of another configuration example of the touch panel in FIG. 1.
Figure 10:
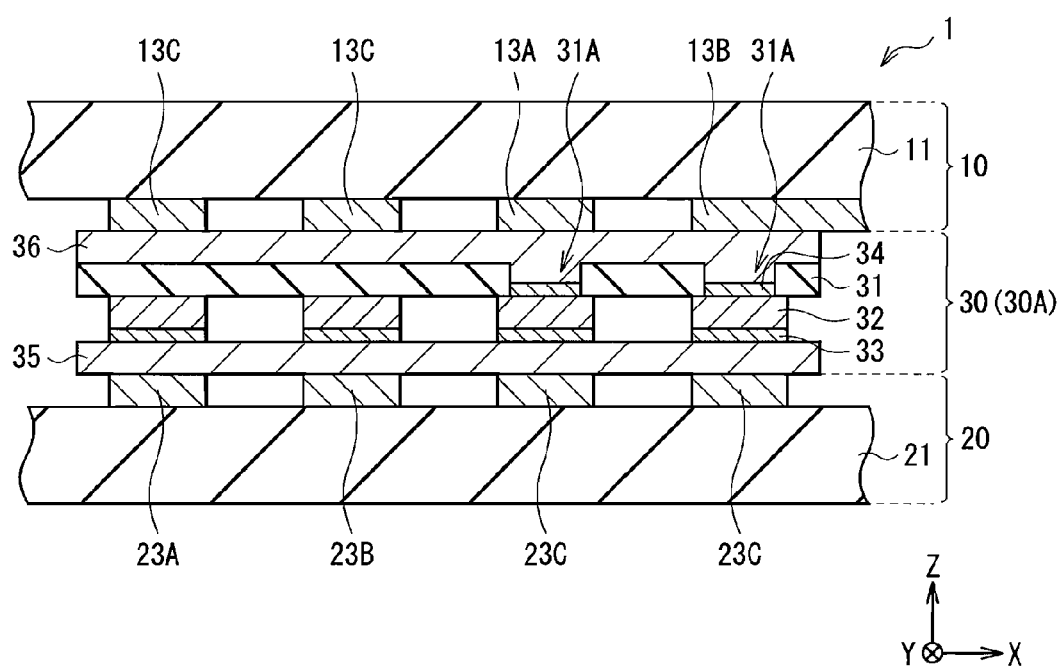
FIG. 10 is a sectional view of the touch panel taken along line A-A in the direction of arrows in FIG. 9.
Figure 11:
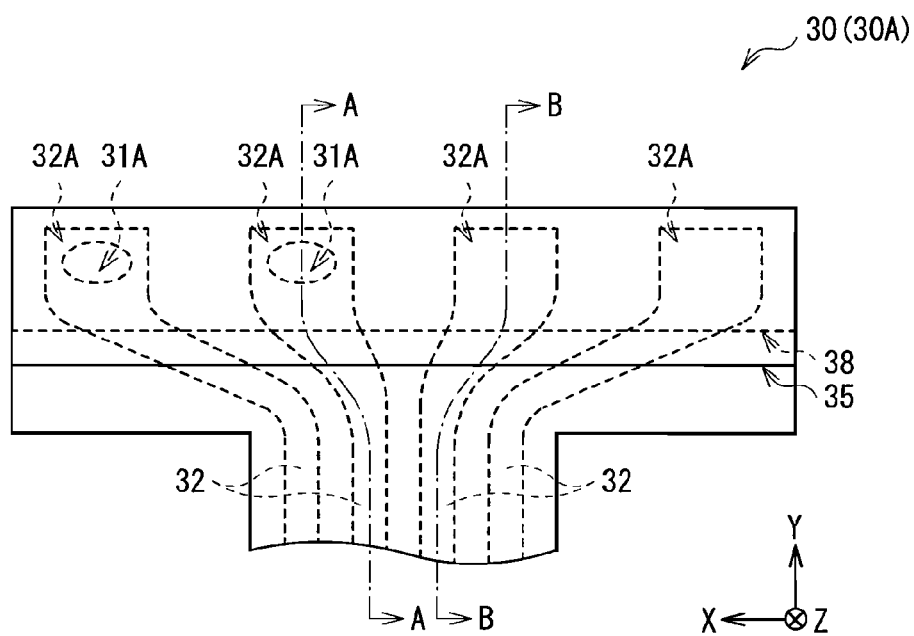
FIG. 11 is a plan view of one surface of one end section of an FPC in FIG. 9.
Figure 12:
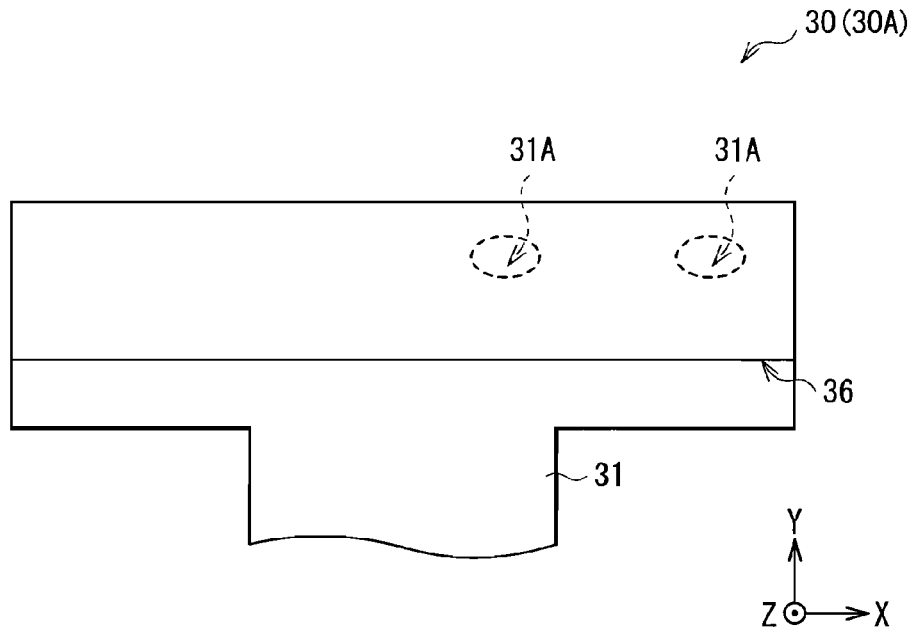
FIG. 12 is a plan view of the other surface of the one end section of the FPC in FIG. 9.

FIG. 4 illustrates a sectional view taken along line A-A in the direction of arrows in FIG. 3. The sectional view illustrated in FIG. 4 corresponds to the end section 30A of the FPC 30 in the touch panel 1. FIG. 5 illustrates a surface view on a side close to the lower substrate 20 of the end section 30A of the FPC 30, and FIG. 6 illustrates a surface view on a side close to the upper substrate 10 of the end section 30A of the FPC 30. FIGS. 7 and 8 illustrate sectional views taken along lines A-A and B-B, respectively, in the direction of arrows in FIG. 5.

The FPC 30 includes a base film 31 (a flexible substrate) extending in one direction. The base film 31 includes a pair of end sections 30A and 30B (a first end section and a second end section) opposed to each other in a direction where the base film 31 extends. The end section 30A has, for example, a larger width than the width of a central section of the base film 31, and is sandwiched between the pair of transparent substrates 11 and 21. On the other hand, as in the case of the end section 30A, the end section 30B has, for example, a larger width than the width of the central section of the base film 31, and the end section 30B is connectable to a device (not illustrated) processing an output signal from the touch panel 1. The base film 31 is made of, for example, polyimide or the like.

Moreover, in the end section 30A of the base film 31, one opening 31A is arranged in each of regions opposed to end sections (sections in contact with the anisotropic conductive film 36 of the FPC 30) of the connection terminals 13A and 13B. The openings 31A are formed by applying a laser beam to the base film 31 or performing a cutting process on the base film 31 by a drill or the like. In addition, a path such as an opening is not specifically arranged in regions opposed to end sections (sections in contact with the anisotropic conductive film 36 of the FPC 30) of the dummy terminals 13C.

Four wiring layers 32 made of, for example, copper foil or the like are arranged on a surface on a side close to the lower substrate 20 of the base film 31. The four wiring layers 32 are formed in contact with the surface on the side close to the lower substrate 20 of the base film 31, and are formed in a single plane. Moreover, the four wiring layers 32 are formed linearly from the end section 30A (more specifically, regions opposed to the connection terminals 23A and 23B and the dummy terminals 23C, or regions opposed to the connection terminals 13A and 13B and the dummy terminals 13C) to the end section 30B. Further, end sections 32A (refer to FIG. 5) on a side close to the end section 30A of the four wiring layers 32 each have a pad shape, and the other sections except for the end sections 32A are formed with a slightly smaller width than the widths of the end sections 32A. In addition, a wiring layer made of the same material as that of the wiring layers 32 is not specifically arranged on a surface on a side close to the upper substrate 10 of the base film 31. Therefore, in the FPC 30 according to the embodiment, a single-sided flexible substrate in which a conductor pattern is formed only on one side is used.

Two wiring layers (hereinafter referred to as "opening-non-opposed wiring layers 32") arranged in regions opposed to the connection terminals 23A and 23B from among the four wiring layers 32 extend from the end section 30A to the end section 30B so as to avoid the openings 31A. On the other hand, two wiring layers (hereinafter referred to as "opening-opposed wiring layers 32") arranged in regions opposed to the connection terminals 13A and 13B from among the four wiring layers 32 extend from the end section 30A to the end section 30B so as to block the openings 31A on a side close to the upper substrate 10. Therefore, the wiring layers 32 are exposed on the bottom surfaces of the openings 31A. The "opening-non-opposed wiring layers 32" in the embodiment correspond to specific examples of "a first wiring layer" in the invention, and the "opening-opposed wiring layers 32" in the embodiment correspond to specific examples of "a second wiring layer" in the invention.

Plating layers 33 and 34 are arranged on surfaces of the end sections 32A of the four wiring layers 32. More specifically, the plating layers 33 are arranged on surfaces on a side close to the lower substrate 20 of four end sections 32A, and the plating layers 34 are arranged on surfaces, which are exposed to the bottom surface of the opening 31A, of the end sections of the two opening-opposed wiring layers 32. The plating layers 33 and 34 are thin, and the plating layers 34 do not have an enough thickness to fill the openings 31A with the plating layers 34.

The anisotropic conductive film 35 (a first conductive member) is formed on surfaces on a side close to the transparent substrate 21 of the plating layers 33, and the anisotropic conductive film 35 is coupled to the connection terminals 23A and 23B and the dummy terminals 23C. On the other hand, the anisotropic conductive film 36 (a second conductive member) is formed on surfaces on a side close to the transparent substrate 11 of the plating layers 34 and a surface on a side close to the transparent substrate 11 of the base film 31, and the anisotropic conductive film 36 is coupled to the connection terminals 13A and 13B and the dummy terminals 13C. Moreover, the openings 31A are filled with the anisotropic conductive film 36.

In this case, the anisotropic conductive films 35 and 36 are made of, for example, sheet-shaped anisotropic conductive films (ACF) or the like, and have adhesion, electrical conductivity in a thickness direction, and insulation in a direction orthogonal to the thickness thereof. Therefore, as illustrated in FIG. 4, even if the anisotropic conductive film 36 is physically coupled to the connection terminals 13A and 13B and the dummy terminal 13C, the connection terminals 13A and 13B and the dummy terminal 13C are not conducted to one another in the in-plane direction of the anisotropic conductive film 36. As in the case of the anisotropic conductive film 36, even if the anisotropic conductive film 35 is physically coupled to the connection terminals 23A and 23B and the dummy terminals 23C, the connection terminals 23A and 23B and the dummy terminals 23C are not conducted to one another in the in-plane direction of the anisotropic conductive film 35. As a result, the connection terminal 13A is electrically connected to only the plating layer 34 opposed to the connection terminal 13A via the anisotropic conductive film 36, and the connection terminal 13B is electrically connected to only the plating layer 34 opposed to the connection terminal 13B via the anisotropic conductive film 36. Moreover, the connection terminal 23A is electrically connected to only the plating layer 33 opposed to the connection terminal 23A via the anisotropic conductive film 35, and the connection terminal 23B is electrically connected to only the plating layer 33 opposed to the connection terminal 23B via the anisotropic conductive film 35.

Therefore, in the touch panel 1, the two connection terminals 13A and 13B coupled to the resistive film 12 on a side close to the transparent substrate 11 are electrically connected to the two opening-opposed wiring layers 32, respectively, via the openings 31A arranged in the base film 31. Moreover, the two connection terminals 23A and 23B coupled to the resistive film 22 on a side close to the transparent substrate 21 are electrically connected to the two opening-non-opposed wiring layers 32, respectively, not via the openings 31A arranged in the base film 31 but via the anisotropic conductive film 35 and the plating layer 33.

In addition, instead of the anisotropic conductive films 35 and 36, isotropic conductive films (not illustrated) may be used. However, in this case, connection terminals are conducted to one another in the in-plane directions of the isotropic conductive films. Therefore, it is necessary to arrange an isotropic conductive film for each of the connection terminals separately.

Moreover, as illustrated in FIGS. 7 and 8, a coverlay 38 protecting the wiring layers 32 and the plating layers 33 from outside is bonded to a surface on a side close to the wiring layers 32 of the FPC 30 by the adhesive layer 37. The coverlay 38 is made of, for example, polyimide or the like.

In FIG. 4, spaces are present in the FPC 30 or between the FPC 30 and the transparent substrate 11 or 21. The spaces may be filled with, for example, an insulating material such as an epoxy resin.

In FIGS. 3 to 6, sections in contact with the anisotropic conductive films 35 and 36 of the connection terminals 13A, 13B, 23A and 23B are placed in an X-axis direction in the drawings in order of the connection terminal 23A, the connection terminal 13A, the connection terminal 23B and the connection terminal 13B. However, the sections may be placed in different order. For example, as illustrated in FIGS. 9 to 12, the sections in contact with the anisotropic conductive films 35 and 36 of the connection terminals 13A, 13B, 23A and 23B may be placed in the X-axis direction in the drawings in order of the connection terminal 23A, the connection terminal 23B, the connection terminal 13A and the connection terminal 13B.

Figure 13:
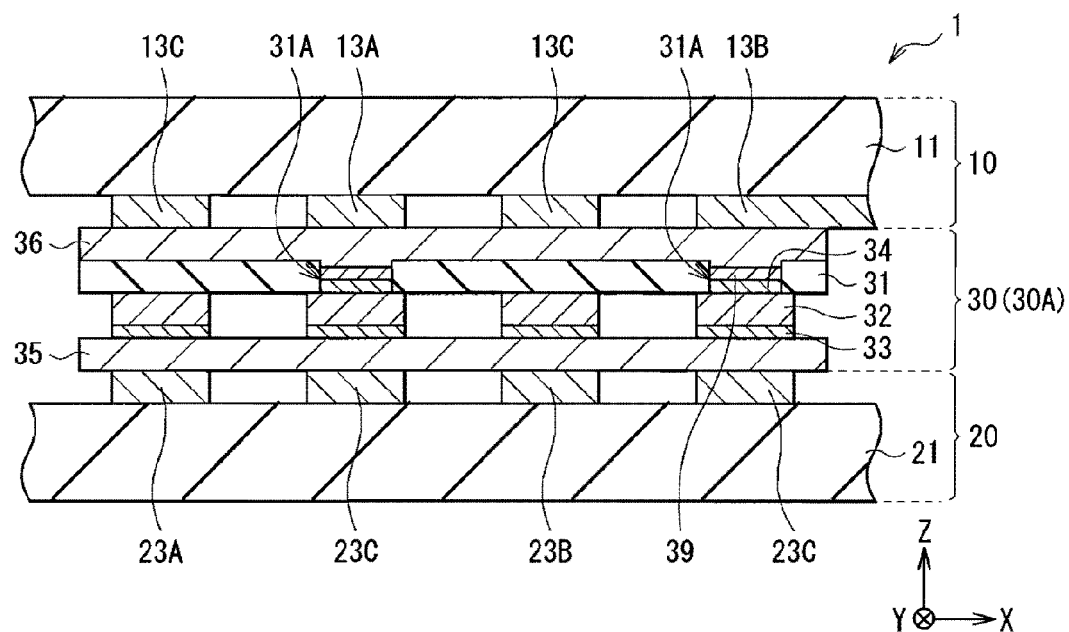
FIG. 13 is a sectional view of still another configuration example of the touch panel in FIG. 1.
Figure 14:
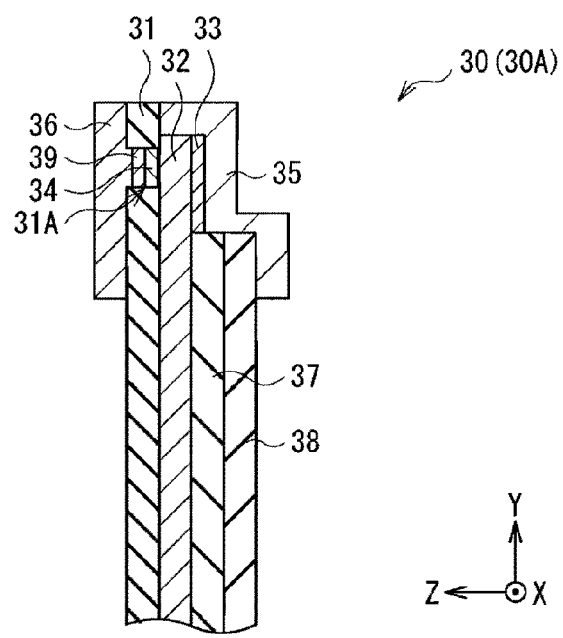
FIG. 14 is a sectional view of the touch panel in FIG. 13.

Moreover, in the case where the base film 31 is thick to some extent, and the openings 31A are deep to some extent, when it is difficult to planarize the surface of the anisotropic conductive film 36 in a step of manufacturing the FPC 30, the openings 31A are preferably filled with an electrical conductive material. For example, as illustrated in FIGS. 13 and 14 (sectional views in a position corresponding to the line B-B in FIG. 5), the openings 31A may be filled with a metal paste layer 39 made of, for example, an Ag paste or the like.

Next, an example of a method of manufacturing the touch panel 1 according to the embodiment will be described below.

First, the resistive films 12 and 22 made of ITO are formed on one surface of the transparent substrate 11 and one surface of the transparent substrate 21, respectively, by a known method such as a sputtering method. After that, the connection terminals 13A, 13B, 23A and 23B and the dummy terminals 13C and 23C are formed by a known method such as a screen printing method around the resistive films 12 and 22 on the surfaces where the resistive films 12 and 22 are formed of the transparent substrates 11 and 21. Thus, the upper substrate 10 and the lower substrate 20 are formed.

Next, the lower substrate 20 is placed on a platform so that the resistive film 22 is placed upward, and the adhesive layer 40 is placed around the resistive film 22 on the transparent substrate 21. After that, the upper substrate 10 is placed on the lower substrate 20 with the adhesive layer 40 in between so that the resistive film 12 is placed downward, and the upper substrate 10 and the lower substrate 20 are bonded together with the adhesive layer 40 in between.

Then, the end section 30A of the FPC 30 is inserted into the notch 40B of the adhesive layer 40. After that, the end section 30A is pressed by a compression bonding head, so that by compression bonding, the connection terminals 13A, 13B and 13C are connected to an ACF layer (a layer to become the anisotropic conductive film 36 in a later step), and the connection terminals 23A, 23B and 23C are connected to an ACF layer (a layer to become the anisotropic conductive film 35 in a later step). Thereby, the ACF layers become the anisotropic conductive films 35 and 36, so the connection terminal 13A and the connection terminal 13B are electrically connected to only the plating layer 33 opposed to the connection terminal 13A and only the plating layer 33 opposed to the connection terminal 13B, respectively, via the anisotropic conductive film 35, and the connection terminal 23A and the connection terminal 23B are electrically connected to only the plating layer 34 opposed to the connection terminal 23A and only the plating layer 34 opposed to the connection terminal 23B, respectively, via the anisotropic conductive film 36. Thus, the touch panel 1 according to the embodiment is manufactured in such a manner.

In the touch panel 1 according to the embodiment, a single-sided flexible substrate in which the wiring layers 33 are arranged in contact with only one surface of the base film 31 is used in the FPC 30. Moreover, the anisotropic conductive film 35 arranged on one surface of the base film 31 is electrically connected to two opening-non-opposed wiring layers 32 arranged on the one surface of the base film 31. On the other hand, the anisotropic conductive film 36 arranged on the other surface of the base film 31 is electrically connected to two opening-opposed wiring layers 32 arranged on the one surface of the base film 31 via the openings 31A arranged in the base film 31. Thus, in the embodiment, instead of arranging the wiring layers on both surfaces of the base film or further arranging a through hole or through hole plating as in the case of related art, the openings 31A are arranged in the base film 31, so that the anisotropic conductive film 36 arranged on the other surface of the base film 31 is electrically connected to the two opening-opposed wiring layer 32 arranged on the one surface of the base film 31. As a result, the thickness of the FPC 30 is reduced by the total thickness of one wiring layer and the through hole plating. Therefore, the FPC 30 with a smaller thickness than ever before is achieved.

Second Embodiment

Figure 15:
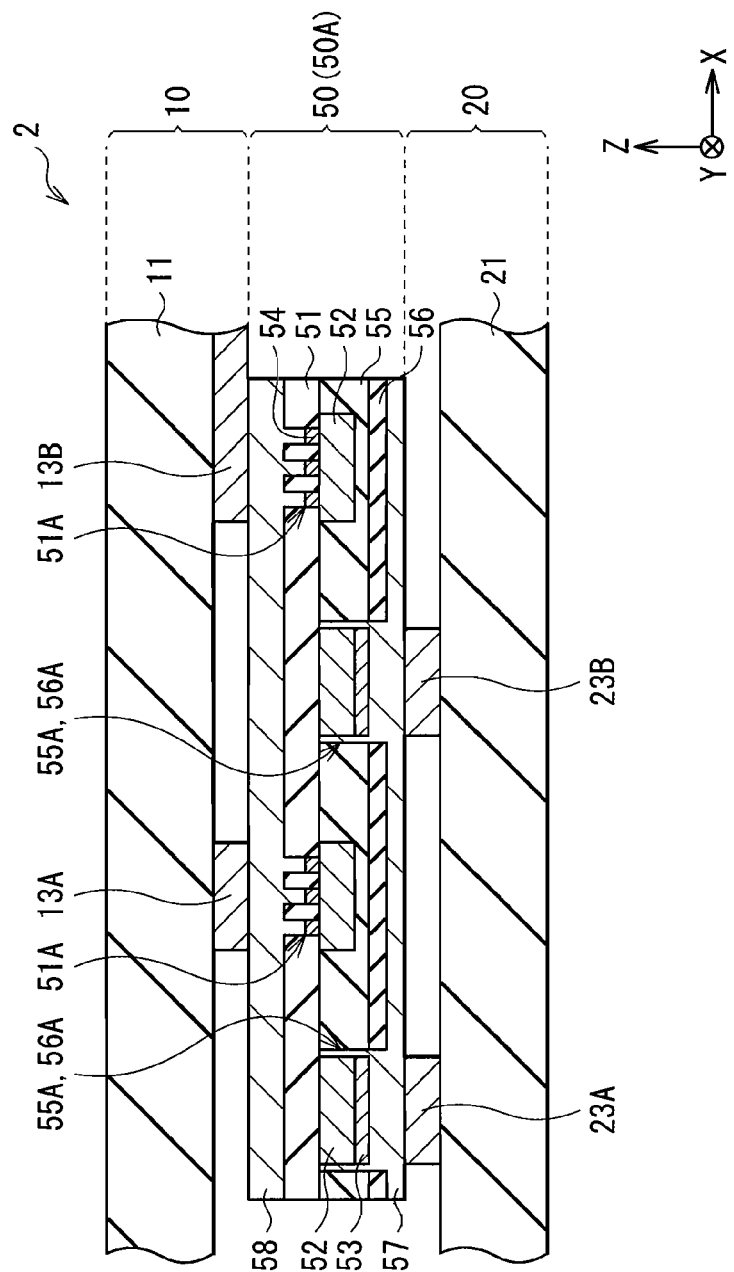
FIG. 15 is a sectional view of a touch panel according to a second embodiment of the invention.

FIG. 15 illustrates an example of a sectional configuration of a touch panel 2 according to a second embodiment of the invention. The touch panel 2 according to the embodiment is distinguished from the touch panel 1 according to the first embodiment by the fact that the touch panel 2 includes a flexible printed circuit (FPC) 50 instead of the FPC 30. Therefore, features different from the first embodiment will be mainly described below, and features common to the first embodiment will not be described.

Figure 16:
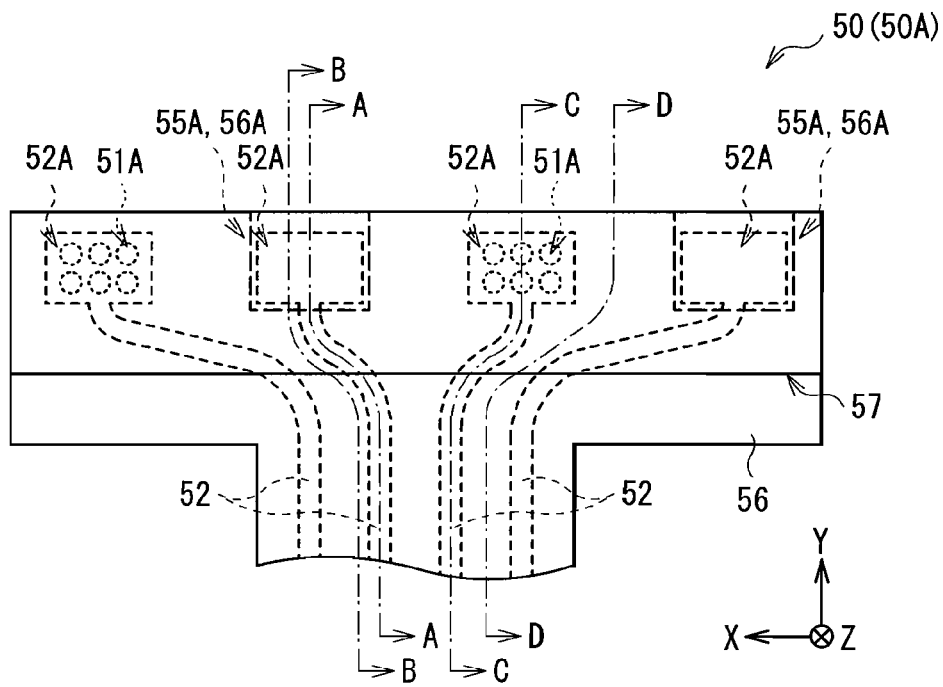
FIG. 16 is a plan view of one surface of one end section of an FPC in FIG. 15.
Figure 17:
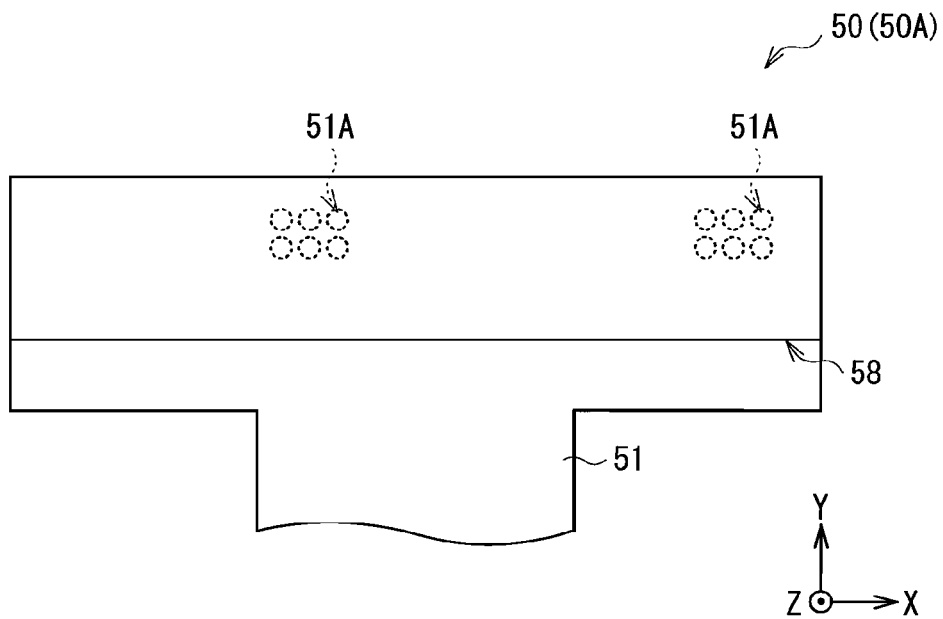
FIG. 17 is a plan view of the other surface of the one end section of the FPC in FIG. 15.
Figure 18:
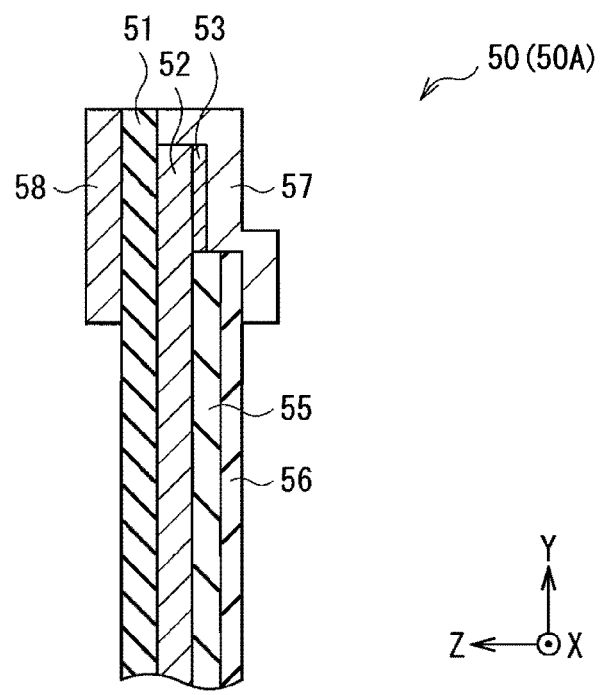
FIG. 18 is a sectional view of the FPC taken along line A-A in the direction of arrows in FIG. 16.
Figure 19:
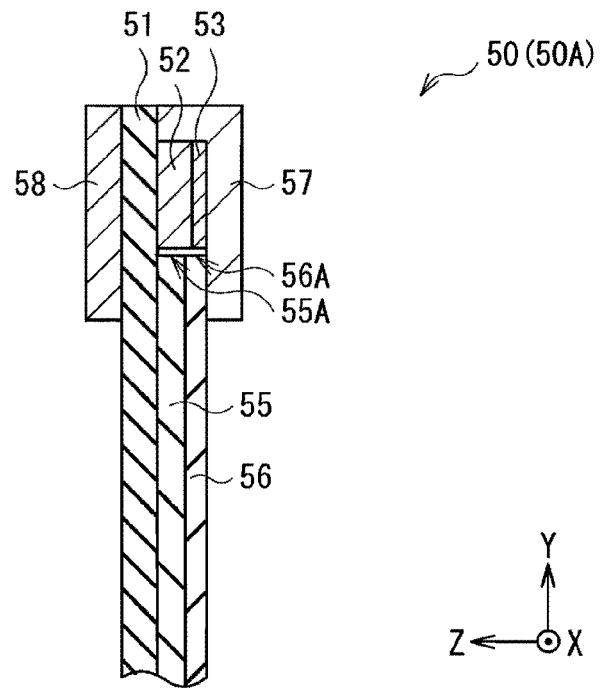
FIG. 19 is a sectional view of the FPC taken along line B-B in the direction of arrows in FIG. 16.
Figure 20:
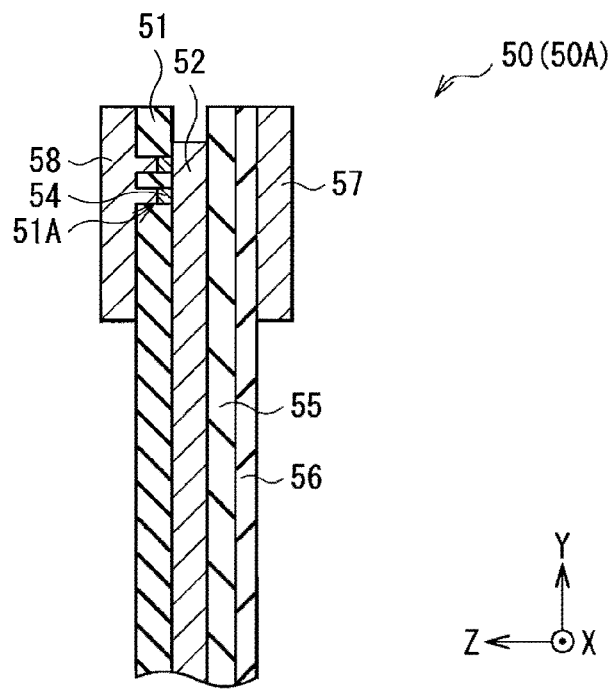
FIG. 20 is a sectional view of the FPC taken along line C-C in the direction of arrows in FIG. 16.
Figure 21:
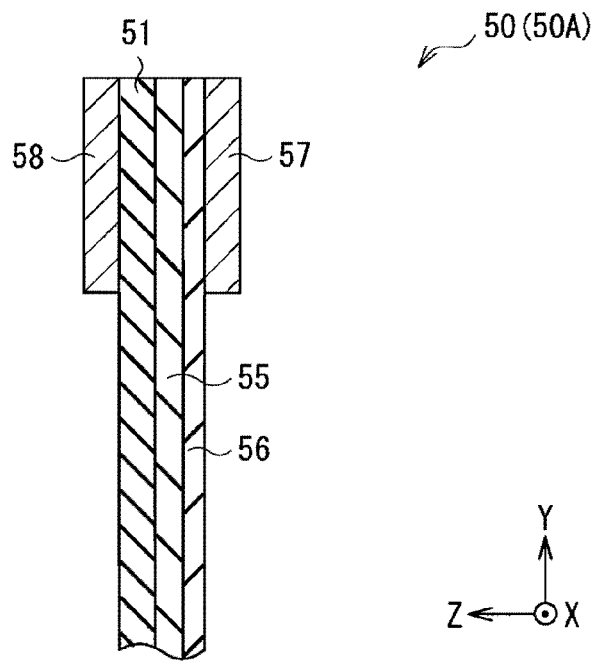
FIG. 21 is a sectional view of the FPC taken along line D-D in the direction of arrows in FIG. 16.

The sectional configuration illustrated in FIG. 15 corresponds to an end section 50A (a section corresponding to the end section 30A of the FPC 30) of the FPC 50 in the touch panel 2. FIG. 16 illustrates a surface view on a side close to the lower substrate 20 of the end section 50A, and FIG. 17 illustrates a surface view on a side close to the upper substrate 10 of the end section 50A. FIGS. 18, 19, 20 and 21 illustrate sectional views taken along lines A-A, B-B, C-C and D-D, respectively, in the direction of arrows in FIG. 16.

The FPC 50 includes a base film 51 (a flexible substrate) extending in one direction. The base film 51 includes a pair of end sections (a first end section and a second end section) opposed to each other in a direction where the base film 51 extends. One (an end section 50A) of the pair of the end sections has, for example, a larger width than the width of a central section of the base film 51, and is sandwiched between the pair of transparent substrates 11 and 21. As in the case of the end section 50A, the other end section has a larger width than the width of the central section of the base film 51, and the other end section is connectable to a device (not illustrated) processing an output signal from the touch panel 2. The base film 51 is made of, for example, polyimide or the like.

Moreover, in the end section 50A of the base film 51, a plurality of (six in FIGS. 6 and 7) openings 51A are arranged in each of regions opposed to end sections (sections in contact with an anisotropic conductive film 58 (which will be described later) of FPC 50) of the connection terminals 13A and 13B. The openings 51A are formed by applying a laser beam to the base film 51 or performing a cutting process on the base film 51 by a drill with a small diameter or the like. In the embodiment, the dummy terminal described in the first embodiment is not arranged, but such a dummy terminal may be arranged.

Four wiring layers 52 made of, for example, copper foil or the like are arranged on a surface on a side close to the lower substrate 20 of the base film 51. The four wiring layers 52 are formed in contact with the surface on the side close to the lower substrate 20 of the base film 51, and are formed in a single plane. Moreover, the four wiring layers 52 are formed linearly from the one end section 50A (more specifically, regions opposed to the connection terminals 23A and 23B and the dummy terminals 23C or regions opposed to the connection terminals 13A and 13B and the dummy terminals 13C) to the other end section. Further, at least end sections 52A on a side close to the end section 50A of the four wiring layers 52 each have a pad shape, and other sections except for the end sections 52A are formed so as to have a sufficiently small width, compared to the widths of the end sections 52A (refer to FIG. 16). In addition, a wiring layer made of the same material as that of the wiring layers 52 is not specifically arranged on a surface on a side close to the upper substrate 10 of the base film 51. Therefore, also in the FPC 50 according to the embodiment, a single-sided flexible substrate in which a conductor pattern is formed only on one side is used.

Two wiring layers (hereinafter referred to "opening-non-opposed wiring layers 52") arranged in regions opposed to the connection terminals 23A and 23B from among the four wiring layers 52 extend from the one end section 50A to the other end section so as to avoid the openings 51A. On the other hand, two wiring layers (hereinafter referred to as "opening-opposed wiring layers 52") arranged in regions opposed to the connection terminals 13A and 13B from among the four wiring layer 52 extend from the one end section 51A to the other end section so as to block the openings 51A on a side close to the upper substrate 10. Therefore, the wiring layers 52 are exposed from the bottom surfaces of the openings 51A.

Plating layers 53 are arranged on surfaces of the end sections 52A of the two opening-non-opposed wiring layers 52. Moreover, plating layers 54 are arranged in sections, which are exposed to the bottom surfaces of the openings 51A, of the two opening-opposed wiring layers 52. The plating layers 53 and 43 are thin, and do not have an enough thickness to fill the openings 51A or notches 55A and 56A which will be described later with the plating layers 53 and 54.

A coverlay 56 (an insulating layer) protecting the wiring layers 52 from outside is bonded to a surface on a side close to the wiring layers 52 of the FPC 50 by an adhesive layer 55. Notches 55A are arranged in the adhesive layer 55 in positions corresponding to the end sections 52A of the two opening-non-opposed wiring layers 52. Moreover, notches 56A are arranged in the coverlay 56 in positions corresponding to the notches 55A. The coverlay 56 is made of, for example, polyimide or the like.

An anisotropic conductive film 57 (a first conductive member) is formed on a surface including surfaces of the plating layers 53 on a side close to the transparent substrate 21 and a surface of the coverlay 56, and the anisotropic conductive film 57 is coupled to the connection terminals 23A and 23B. On the other hand, an anisotropic conductive film 58 (a second conductive member) is formed on surfaces of the plating layer 54 on a side close to the transparent substrate 11 and a surface on a side close to the transparent substrate 11 of the base film 51, and the anisotropic conductive film 58 is coupled to the connection terminals 13A and 13B. Further, the openings 51A are filled with the anisotropic conductive film 58, and the notches 55A and 56A are filled with the anisotropic conductive film 57.

In this case, the anisotropic conductive films 57 and 58 are made of, for example, sheet-shaped anisotropic conductive films (ACF) or the like, and have adhesion, electrical conductivity in a thickness direction, and insulation in a direction orthogonal to the thickness thereof. Therefore, as illustrated in FIG. 15, even if the anisotropic conductive film 58 is physically coupled to the connection terminals 13A and 13B, the connection terminals 13A and 13B are not conducted to each other in the in-plane direction of the anisotropic conductive film 58. As in the case of the anisotropic conductive film 58, even if the anisotropic conductive film 57 is physically coupled to the connection terminals 23A and 23B, the connection terminals 23A and 23B are not conducted to each other in the in-plane direction of the anisotropic conductive film 57. As a result, the connection terminal 13A is electrically connected to only the plating layer 54 opposed to the connection terminal 13A via the anisotropic conductive film 58, and the connection terminal 13B is electrically connected to only the plating layer 54 opposed to the connection terminal 13B via the anisotropic conductive film 58. Moreover, the connection terminal 23A is electrically connected to only the plating layer 54 opposed to the connection terminal 23A via the anisotropic conductive film 57, and the connection terminal 23B is electrically connected to only the plating layer 53 opposed to the connection terminal 23B via the anisotropic conductive film 57.

Therefore, in the touch panel 2, the two connection terminals 13A and 13B coupled to the resistive film 12 on a side close to the transparent substrate 11 are electrically connected to the two opening-opposed wiring layers 52, respectively, via the openings 51A arranged in the base film 51. Moreover, the two connection terminals 23A and 23B coupled to the resistive film 22 on a side close to the transparent substrate 21 are electrically connected to the two opening-non-opposed wiring layers 52, respectively, not via the openings 51A arranged in the base film 51 but via the anisotropic conductive film 57 and the plating layer 53.

In addition, instead of the anisotropic conductive films 57 and 58, isotropic conductive films (not illustrated) may be used. However, in this case, connection terminals are conducted to each other in the in-plane directions of the isotropic conductive films. Therefore, it is necessary to arrange an isotropic conductive film for each of the connection terminals separately.

Figure 22:
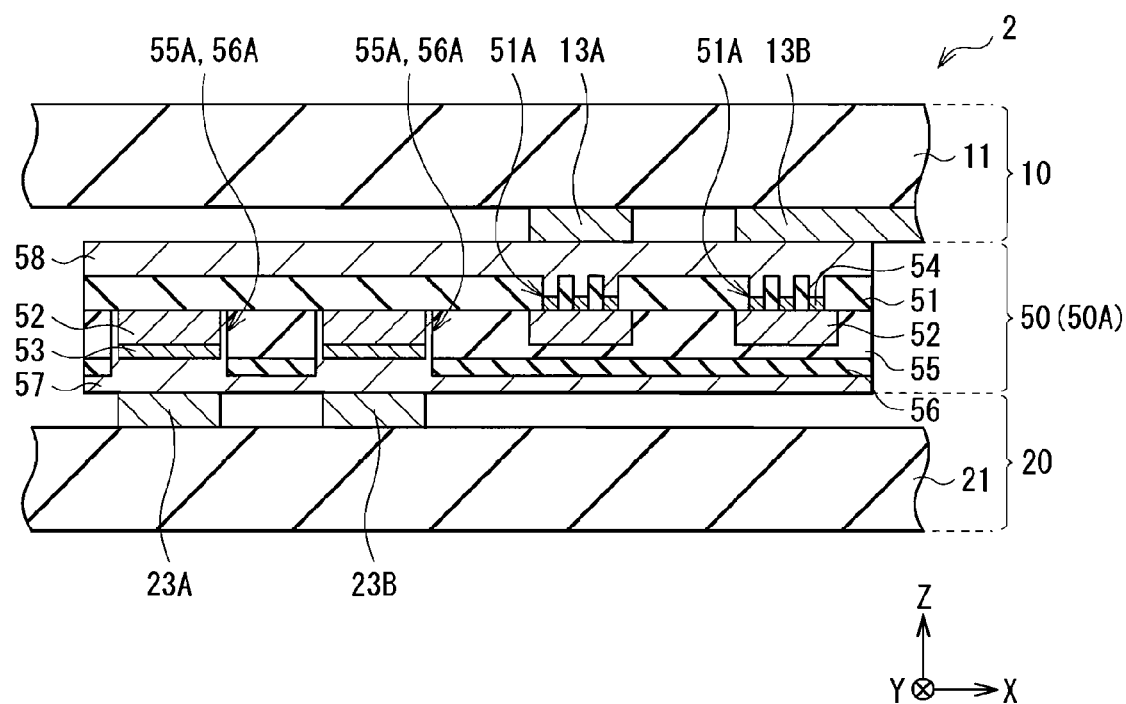
FIG. 22 is a sectional view of another configuration example of the touch panel in FIG. 15.
Figure 23:
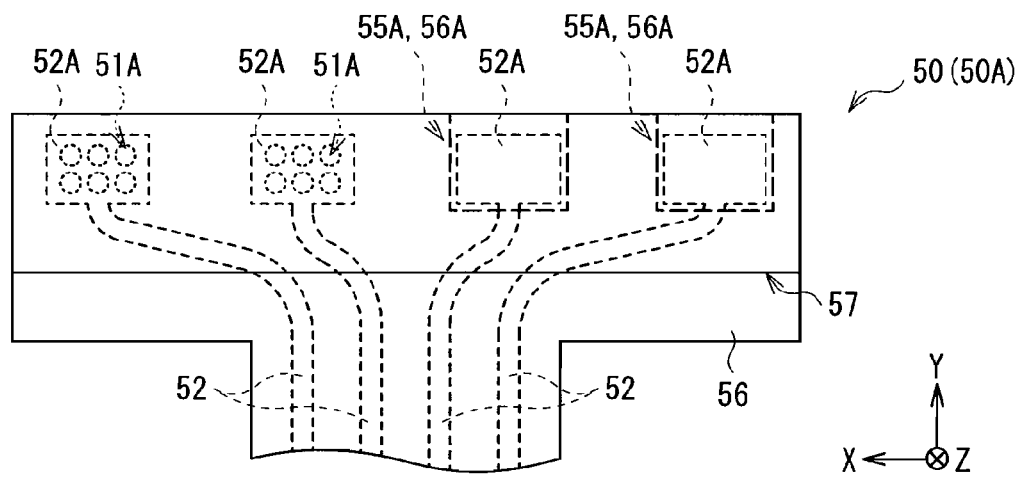
FIG. 23 is a plan view of one surface of one end section of an FPC in FIG. 22.
Figure 24:
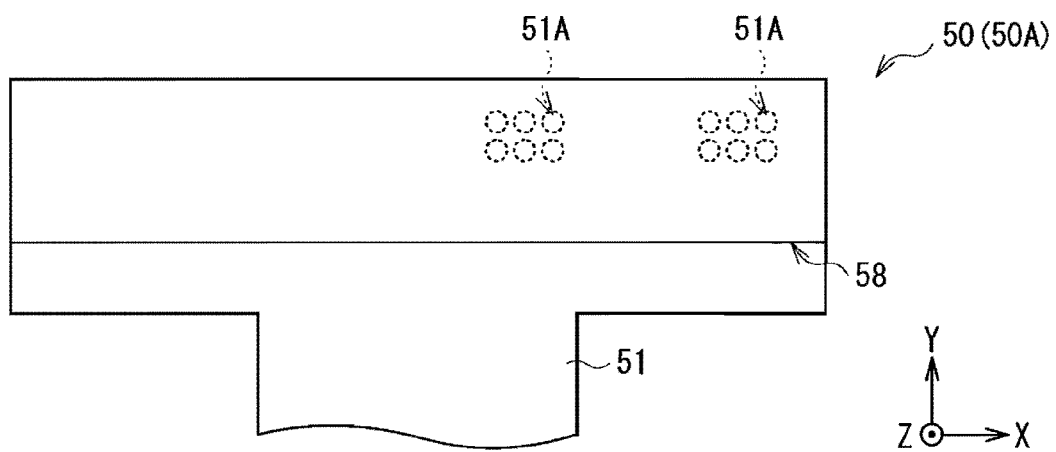
FIG. 24 is a plan view of the other surface of the one end section of the FPC in FIG. 22.

Moreover, in FIGS. 15 to 17, sections in contact with the anisotropic conductive films 57 and 58 of the connection terminals 13A, 13B, 23A and 23B are placed in an X-axis direction in the drawings in order of the connection terminal 23A, the connection terminal 13A, the connection terminal 23B and the connection terminal 13B. However, the sections may be placed in different order. For example, as illustrated in FIGS. 22 to 24, the sections in contact with the anisotropic conductive films 57 and 58 of the connection terminals 13A, 13B, 23A and 23B may be placed in the X-axis direction in the drawings in order of the connection terminal 23A, the connection terminal 23B, the connection terminal 13A and the connection terminal 13B.

In the touch panel 2 according to the embodiment, a single-sided flexible substrate in which the wiring layers 52 are arranged in contact with only one surface of the base film 51 is used in the FPC 50. Moreover, the anisotropic conductive film 57 arranged on one surface of the base film 51 is electrically connected to two opening-non-opposed wiring layers 52 arranged on the one surface of the base film 51. On the other hand, the anisotropic conductive film 58 arranged on the other surface of the base film 51 is electrically connected to two opening-opposed wiring layers 52 arranged on the one surface of the base film 51 via the openings 51A arranged in the base film 51. Thus, in the embodiment, instead of arranging the wiring layers on both surfaces of the base film or further arranging a through hole or through hole plating as in the case of related art, the openings 51A are arranged in the base film 51, so that the anisotropic conductive film 58 arranged on the other surface of the base film 51 is electrically connected to the wiring layers 52 arranged on the one surface of the base film 51. As a result, the thickness of the FPC 50 is reduced by the total thickness of one wiring layer and the through hole plating. Therefore, the FPC 50 with a smaller thickness than ever before is achieved.

Moreover, in the embodiment, as illustrated in FIG. 15, in the end section 50A of the FPC 50, the coverlay 56 and the adhesive layer 55 are arranged between the anisotropic conductive film 57 arranged on a side close to the wiring layers 52 of the base layer 51 and the base film 51. Thereby, the coverlay 56 and the adhesive layer 55 are arranged in a space between the wiring layers 52, so that the thicknesses in an alignment direction (a horizontal direction) of the four wiring layers 52 are uniform without a space in the FPC 50. As a result, compared to the case where a space is included in a flexible printed circuit in related art, crinkles or asperities on surfaces of the touch panel 2 caused by connection by compression bonding in a manufacturing step are reduced. Therefore, even if the whole upper surface of the transparent substrate 11 is used as a part of an enclosure of a device, the flatness of enclosure surfaces may not be impaired.

Third Embodiment

Figure 25:
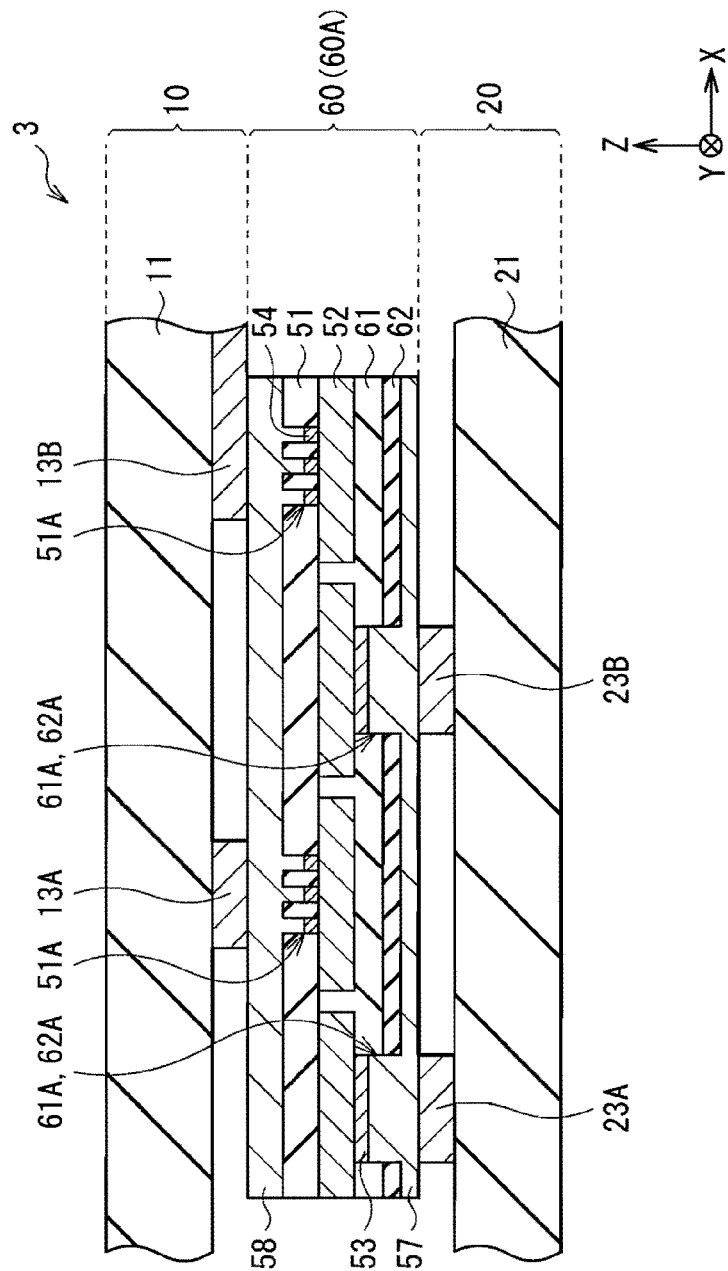
FIG. 25 is a sectional view of a touch panel according to a third embodiment of the invention.

FIG. 25 illustrates an example of a sectional configuration of a touch panel 3 according to a third embodiment of the invention. The touch panel 3 according to the embodiment is distinguished from the touch panel 2 according to the second embodiment by the fact that the touch panel 3 includes a flexible printed circuit (FPC) 60 instead of the FPC 50 in the second embodiment. Therefore, features different from the second embodiment will be mainly described below, and features common to the second embodiment will not be described.

Figure 26:
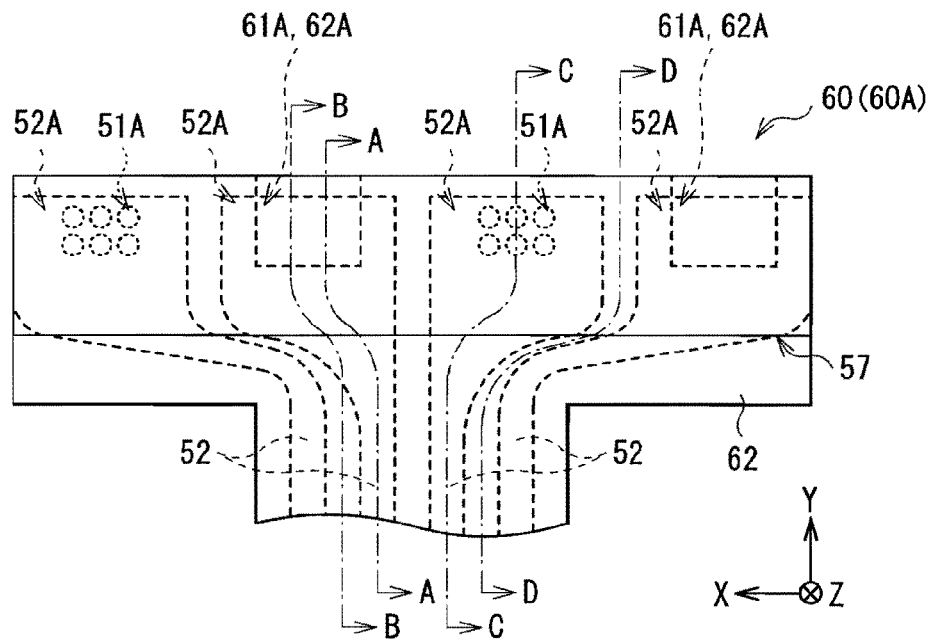
FIG. 26 is a plan view of one surface of one end section of an FPC in FIG. 25.
Figure 27:
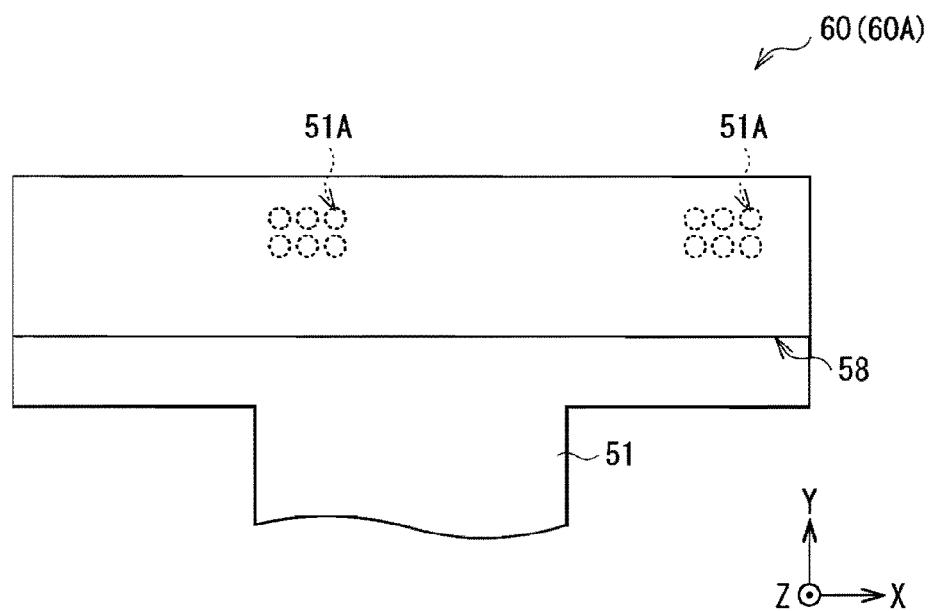
FIG. 27 is a plan view of the other surface of the one end section of the FPC in FIG. 25.
Figure 28:
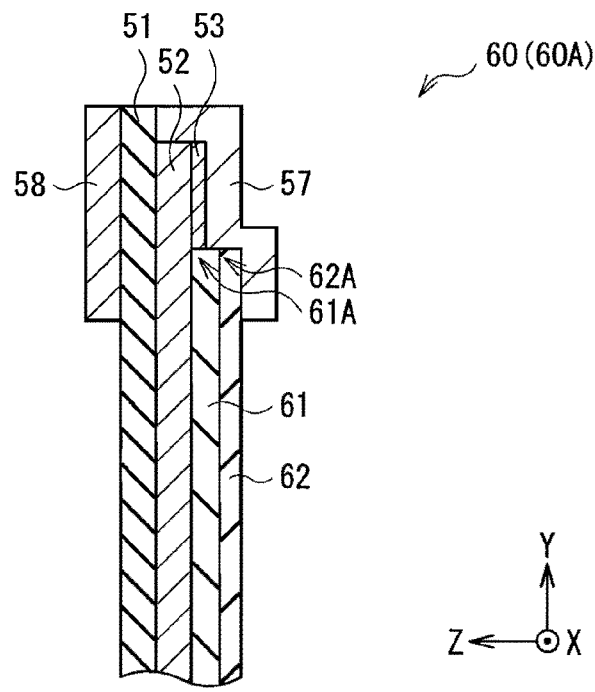
FIG. 28 is a sectional view of the FPC taken along line A-A in the direction of arrows in FIG. 26.
Figure 29:
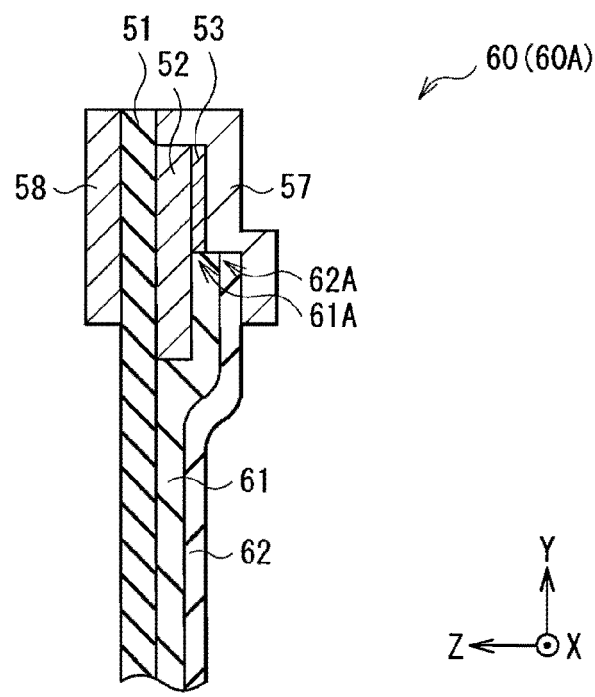
FIG. 29 is a sectional view of the FPC taken along line B-B in the direction of arrows in FIG. 26.
Figure 30:
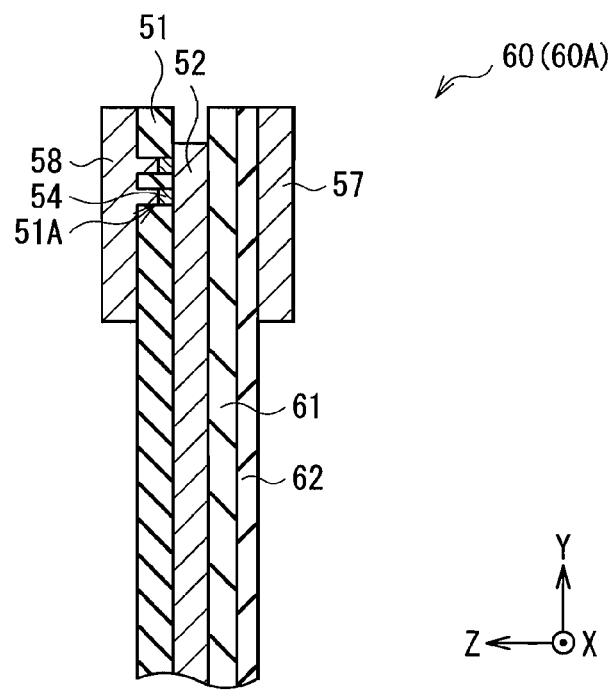
FIG. 30 is a sectional view of the FPC taken along line C-C in the direction of arrows in FIG. 26.
Figure 31:
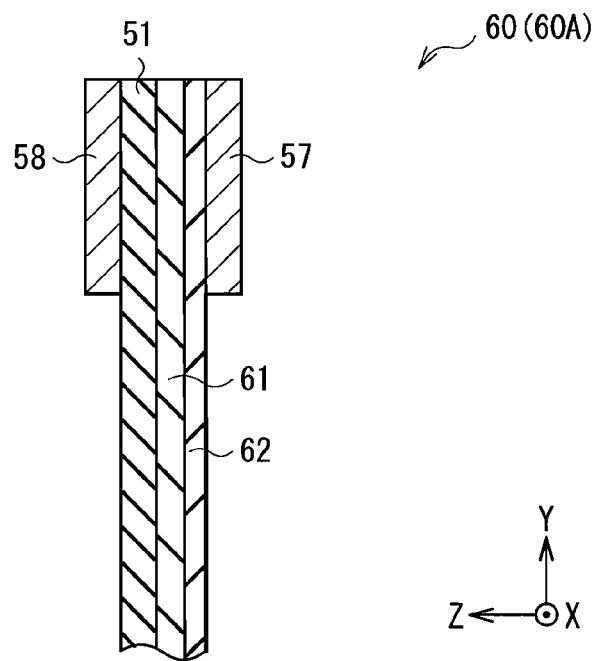
FIG. 31 is a sectional view of the FPC taken along line D-D in the direction of arrows in FIG. 26.

The sectional configuration illustrated in FIG. 25 corresponds to an end section 60A (a section corresponding to the end section 50A of the FPC 50) of the FPC 60 in the touch panel 3. FIG. 26 illustrates a surface view on a side close to the lower substrate 20 of the end section 60A, and FIG. 27 illustrates a surface view on a side close to the upper substrate 10 of the end section 60A. FIGS. 28, 29, 30 and 31 illustrate sectional views taken along lines A-A, B-B, C-C and D-D, respectively, in the direction of arrows in FIG. 26.

In the embodiment, the widths of the end sections 52A (widths in an alignment direction of the four wiring layers 52) are larger than the widths of the end sections 52A in the second embodiment, and a space between the end sections 52A in the embodiment is smaller than a space between the end sections 52A in the second embodiment. On the other hand, the widths of the plating layers 53 arranged on the end sections 52A in the embodiment are equal to or nearly equal to the widths of the plating layers 53 in the second embodiment, and are smaller than the widths of the end sections 52A in the embodiment.

Moreover, a coverlay 62 (an insulating layer) protecting the wiring layers 52 from outside is bonded to a surface on a side close to the wiring layers 52 of the FPC 60 by an adhesive layer 61. Notches 61A are arranged in the adhesive layer 61 in positions corresponding to the plating layers 53 in the end sections 52A of the two opening-non-opposed wiring layers 52. Moreover, notches 62A are arranged in the coverlay 62 in positions corresponding to the notches 61A. The coverlay 62 is made of, for example, polyimide or the like.

The anisotropic conductive film 57 (the first conductive member) is formed on a surface including surfaces of the plating layers 53 on a side close to the transparent substrate 21 and a surface of the coverlay 62, and the anisotropic conductive film 57 is coupled to the connection terminals 23A and 23B. On the other hand, the anisotropic conductive film 58 (the second conductive member) is formed on surfaces of the plating layers 54 on a side close to the transparent substrate 11 and a surface on a side close to the transparent substrate 11 of the base film 51, and the anisotropic conductive film 58 is coupled to the connection terminals 13A and 13B. Further, the openings 51A are filled with the anisotropic conductive film 58, and the notches 61A and 62A are filled with the anisotropic conductive film 57.

Also in the embodiment, instead of the anisotropic conductive films 57 and 58, isotropic conductive films (not illustrated) may be used. However, in this case, connection terminals are conducted to each other in the in-plane directions of the isotropic conductive films. Therefore, it is necessary to arrange an isotropic conductive film for each of the connection terminals separately.

Figure 32:
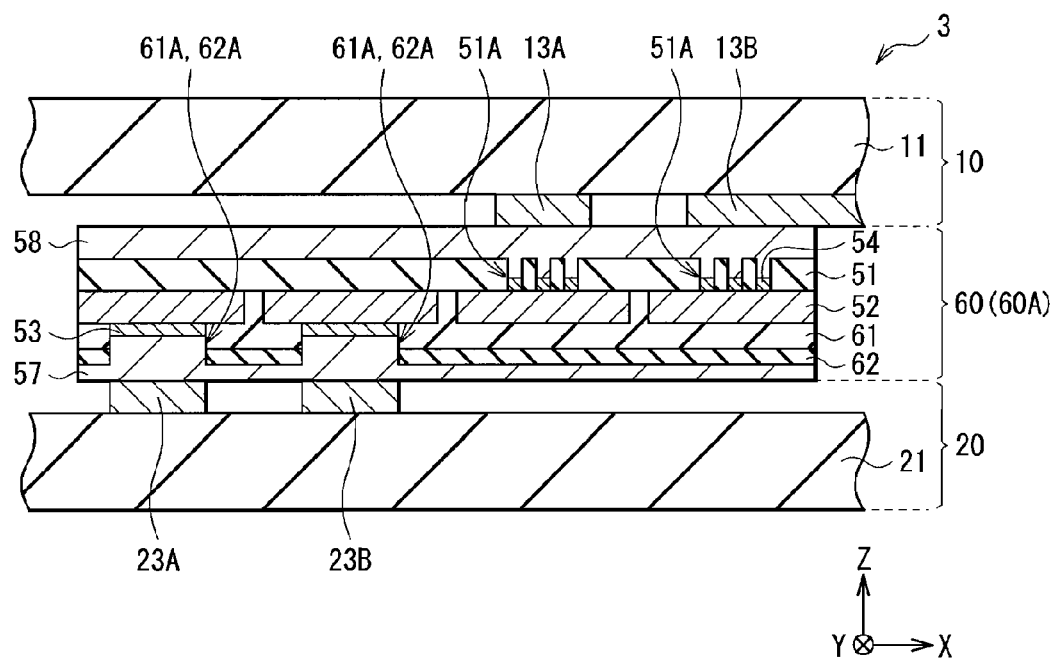
FIG. 32 is a sectional view of still another configuration example of the touch panel in FIG. 25.
Figure 33:
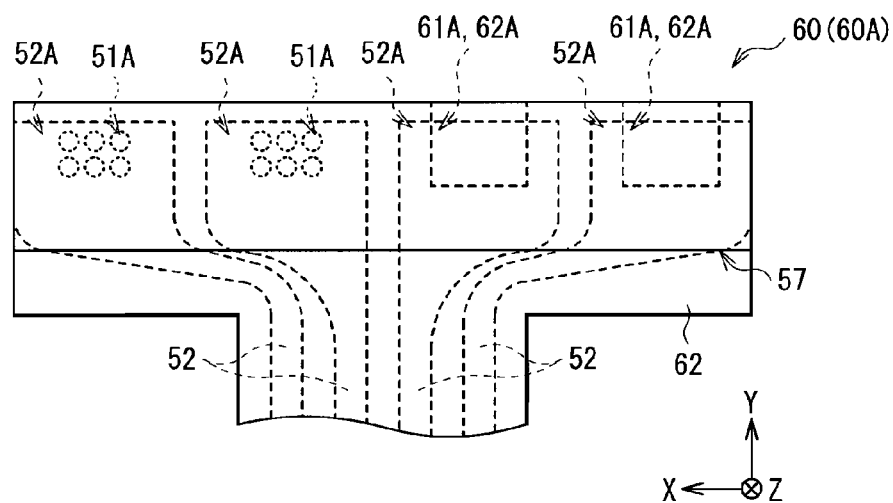
FIG. 33 is a plan view of one surface of one end section of an FPC in FIG. 32.
Figure 34:
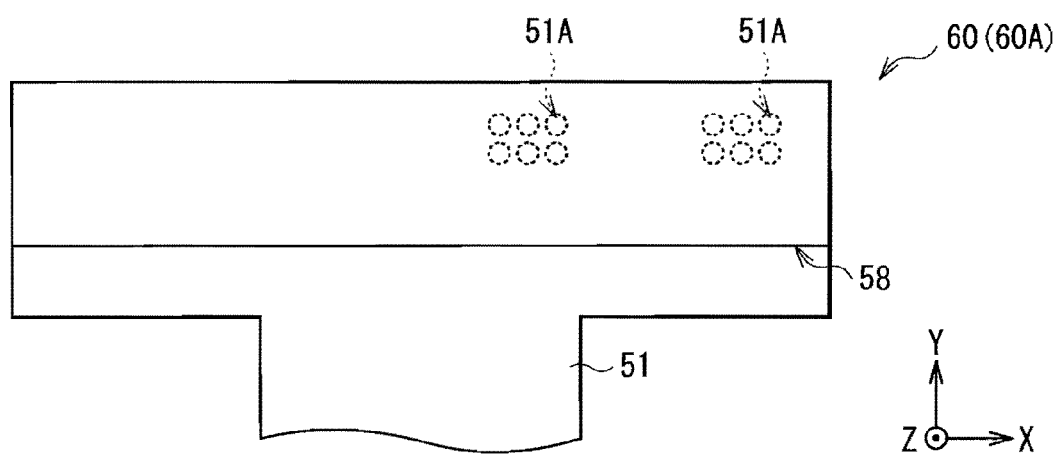
FIG. 34 is a plan view of the other surface of the one end section of the FPC in FIG. 32.

Moreover, in FIGS. 25 and 27, sections in contact with the anisotropic conductive films 57 and 58 of the connection terminals 13A, 13B, 23A and 23B are placed in an X-axis direction in the drawings in order of the connection terminal 23A, the connection terminal 13A, the connection terminal 23B and the connection terminal 13B. However, the sections may be placed in different order. For example, as illustrated in FIGS. 32 to 34, the sections in contact with the anisotropic conductive films 57 and 58 of the connection terminals 13A, 13B, 23A and 23B may be placed in the X-axis direction in the drawings in order of the connection terminal 23A, the connection terminal 23B, the connection terminal 13A and the connection terminal 13B.

In the touch panel 3 according to the embodiment, a single-sided flexible substrate in which the wiring layers 52 are arranged in contact with only one surface of the base film 51 is used in the FPC 60. Moreover, the anisotropic conductive film 57 arranged on one surface of the base film 51 is electrically connected to two opening-non-opposed wiring layers 52 arranged on the one surface of the base film 51. On the other hand, the anisotropic conductive film 58 arranged on the other surface of the base film 51 is electrically connected to two opening-opposed wiring layers 52 arranged on the one surface of the base film 51 via the openings 51A arranged in the base film 51. Thus, in the embodiment, instead of arranging the wiring layers on both surfaces of the base film or further arranging a through hole or through hole plating as in the case of related art, the openings 51A are arranged in the base film 51, so that the anisotropic conductive film 58 arranged on the other surface of the base film 51 is electrically connected to the wiring layers 52 arranged on the one surface of the base film 51. As a result, the thickness of the FPC 60 is reduced by the total thickness of one wiring layer and the through hole plating. Therefore, the FPC 60 with a smaller thickness than ever before is achieved.

Moreover, in the embodiment, as illustrated in FIG. 25, in the end section 60A of the FPC 60, the coverlay 62 and the adhesive layer 61 are arranged between the anisotropic conductive film 57 arranged on a side close to the wiring layers 52 of the base film 51 and the base film 51. Thereby, the coverlay 62 and the adhesive layer 61 are arranged in a space between the wiring layers 52, so the thicknesses in an alignment direction (a horizontal direction) of the four wiring layers 52 are uniform without a space in the FPC 60. As a result, compared to the case where a space is included in a flexible printed circuit in related art, crinkles or asperities on surfaces of the touch panel 3 caused by connection by compression bonding in a manufacturing step are reduced. Therefore, even if the whole upper surface of the transparent substrate 11 is used as a part of an enclosure of a device, the flatness of enclosure surfaces may not be impaired.

Fourth Embodiment

Figure 35:
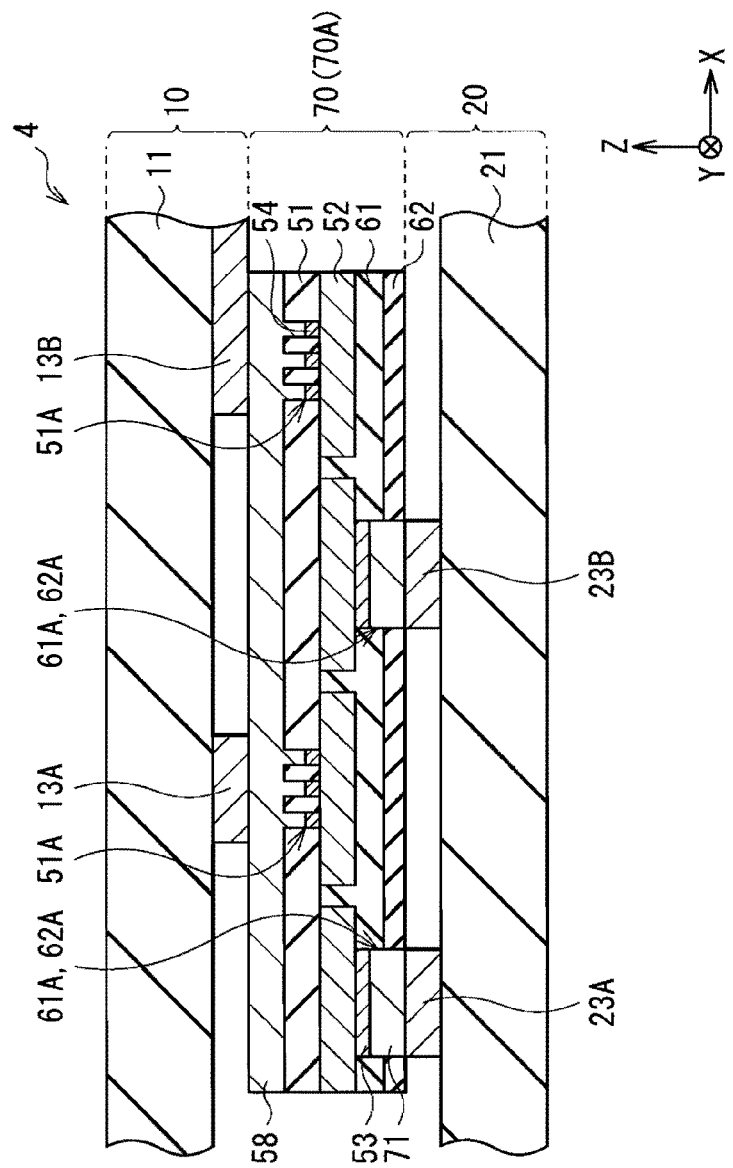
FIG. 35 is a sectional view of a touch panel according to a fourth embodiment of the invention.

FIG. 35 illustrates an example of a sectional configuration of a touch panel 4 according to a fourth embodiment of the invention. The touch panel 4 according to the embodiment is distinguished from the touch panel 3 according to the third embodiment by the fact that the touch panel 4 includes a flexible printed circuit (FPC) 70 instead of the FPC 60 in the third embodiment. Therefore, features different from the third embodiment will be mainly described below, and features common to the third embodiment will not be described.

Figure 36:
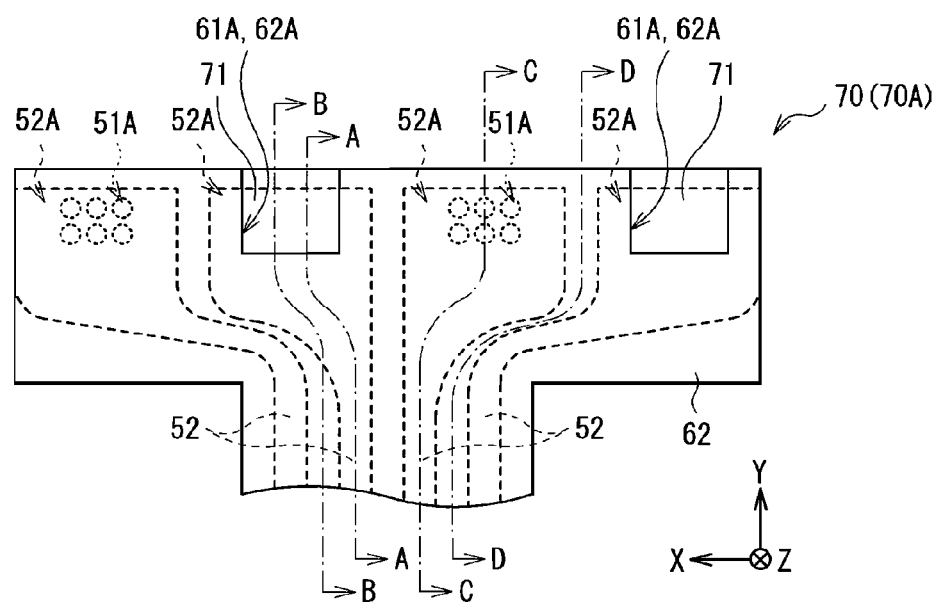
FIG. 36 is a plan view of one surface of one end section of an FPC in FIG. 35.
Figure 37:
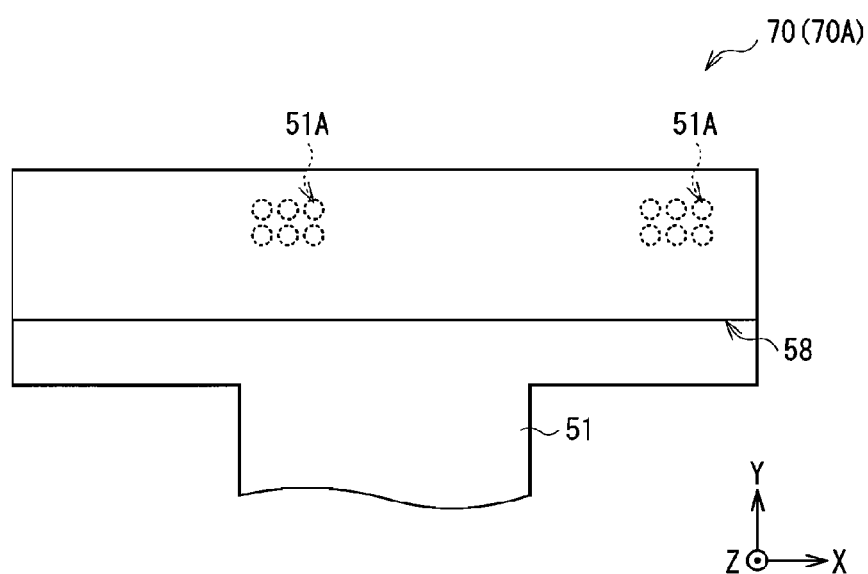
FIG. 37 is a plan view of the other surface of the one end section of the FPC in FIG. 35.
Figure 38:
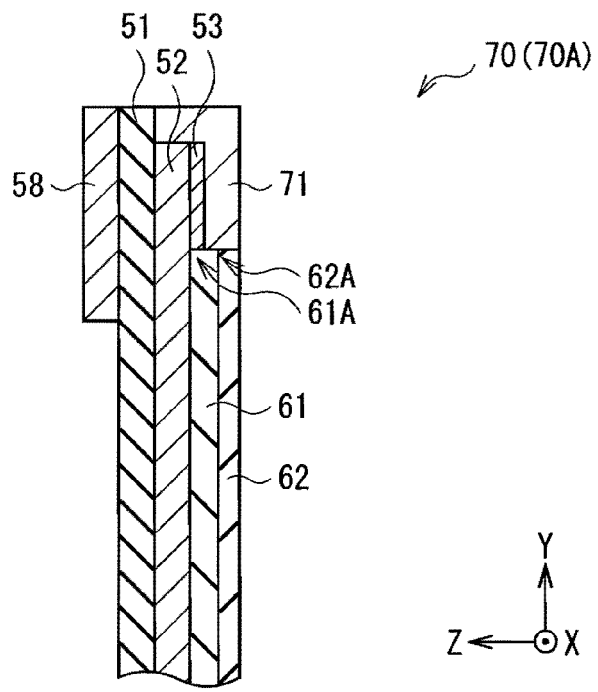
FIG. 38 is a sectional view of the FPC taken along line A-A in the direction of arrows in FIG. 36.
Figure 39:
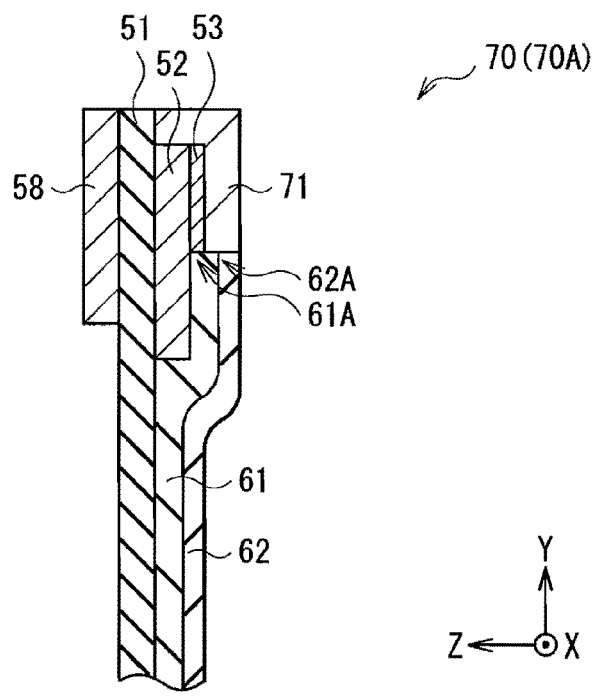
FIG. 39 is a sectional view of the FPC taken along line B-B in the direction of arrows in FIG. 36.
Figure 40:
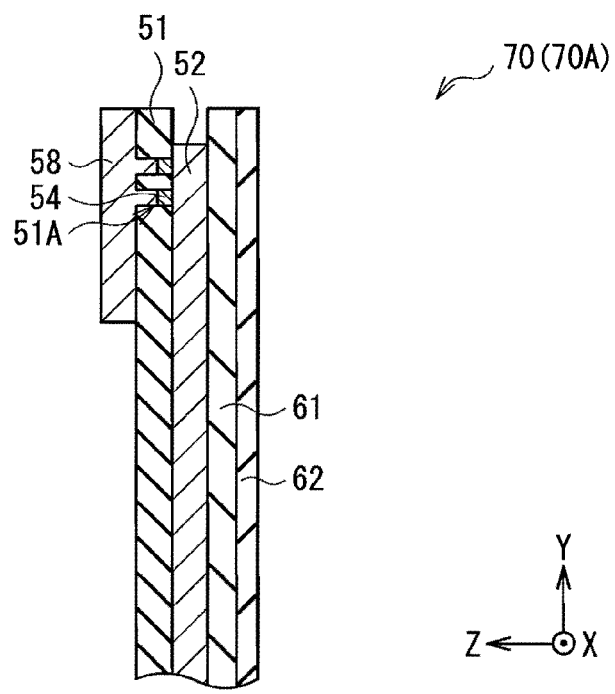
FIG. 40 is a sectional view of the FPC taken along line C-C in the direction of arrows in FIG. 36.
Figure 41:
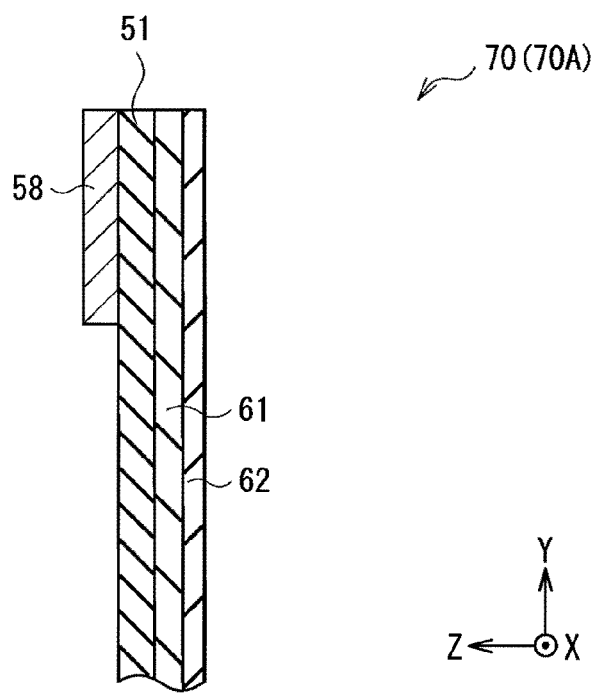
FIG. 41 is a sectional view of the FPC taken along line D-D in the direction of arrows in FIG. 36.

The sectional configuration illustrated in FIG. 35 corresponds to an end section 70A (a section corresponding to the end section 60A of the FPC 60) of the FPC 70 in the touch panel 4. FIG. 36 illustrates a surface view on a side close to the lower substrate 20 of the end section 70A, and FIG. 37 illustrates a surface view on a side close to the upper substrate 10 of the end section 70A. FIGS. 38, 39, 40 and 41 illustrate sectional views taken along lines A-A, B-B, C-C and D-D, respectively, in the direction of arrows in FIG. 36.

In the embodiment, instead of the anisotropic conductive film 57 in the third embodiment, anisotropic conductive films 71 (first conductive members) are arranged. The anisotropic conductive films 71 are formed in regions opposed to the opening-opposed wiring layers 52, and the notches 61A and 62A are filled with the anisotropic conductive films 71. Therefore, the anisotropic conductive films 71 are formed in a single plane where the coverlay 62 and the adhesive layer 61 are formed, and are not formed on a surface of the coverlay 62.

As in the case of the anisotropic conductive film 57, the anisotropic conductive films 71 are made of, for example, sheet-shaped anisotropic conductive films (ACF) or the like, and have adhesion, electrical conductivity in a thickness direction, and insulation in a direction orthogonal to the thickness thereof. Thereby, the connection terminal 23A is electrically connected to only the plating layer 53 opposed to the connection terminal 23A via the anisotropic conductive film 71, and the connection terminal 23B is electrically connected to only the plating layer 53 opposed to the connection terminal 23B via the anisotropic conductive film 71.

Therefore, in the touch panel 4, the two connection terminals 13A and 13B coupled to the resistive film 12 on a side close to the transparent substrate 11 are electrically connected to the two opening-opposed wiring layers 52, respectively, via the openings 51A arranged in the base film 51. Moreover, the two connection terminals 23A and 23B coupled to the resistive film 22 on a side close to the transparent substrate 21 are electrically connected to the two opening-non-opposed wiring layers 52, respectively, not via the openings 51A arranged in the base film 51 but via the anisotropic conductive films 71 and the plating layers 53.

In addition, instead of the anisotropic conductive films 58 and 71, isotropic conductive films (not illustrated) may be used. However, in the case where the isotropic conductive film is used instead of the anisotropic conductive film 58, connection terminals are conducted to each other in the in-plane direction of the isotropic conductive film. Therefore, it is necessary to arrange an isotropic conductive film for each of the connection terminals separately. On the other hand, in the case where the isotropic conductive films are used instead of the anisotropic conductive films 71, even if connection terminals are conducted to each other in the in-plane directions of the isotropic conductive films, the isotropic conductive films may not be electrically connected to the opening-opposed wiring layers 52 in adjacent to the isotropic conductive films.

Figure 42:
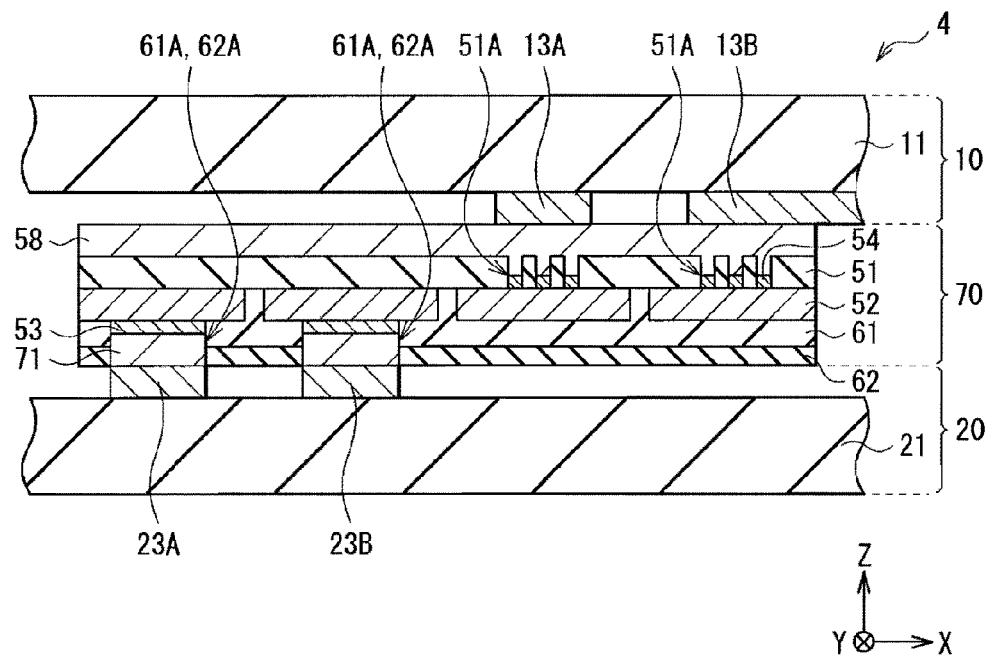
FIG. 42 is a sectional view of another configuration example of the touch panel in FIG. 35.
Figure 43:
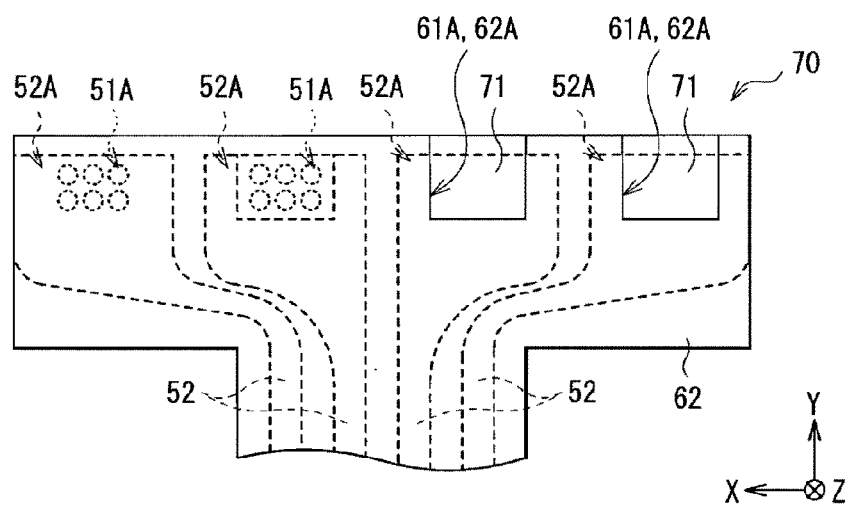
FIG. 43 is a plan view of one surface of one end section of an FPC in FIG. 42.
Figure 44:
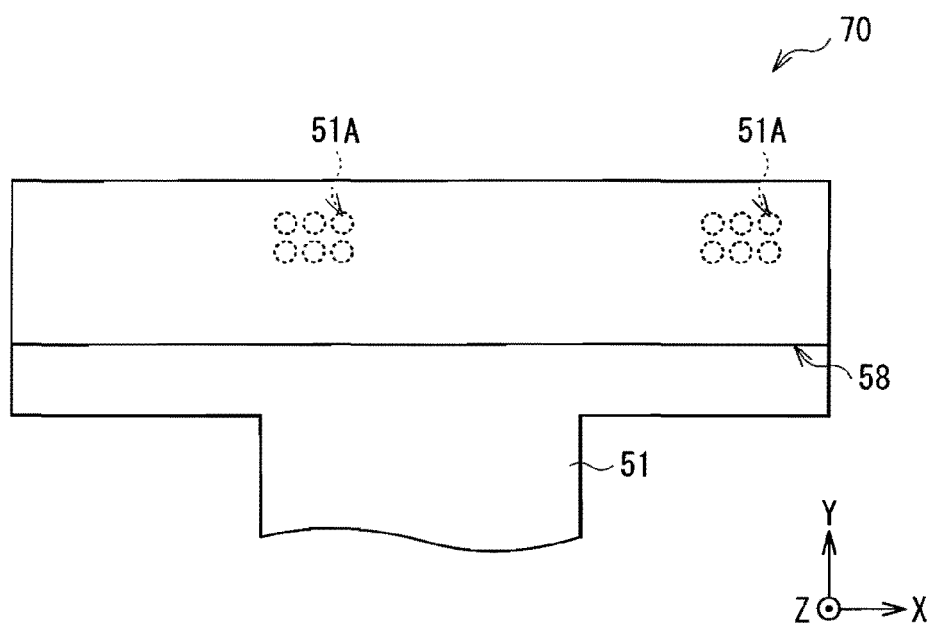
FIG. 44 is a plan view of the other surface of the one end section of the FPC in FIG. 42.

Moreover, in FIGS. 35 to 37, sections in contact with the anisotropic conductive films 58 and 71 of the connection terminals 13A, 13B, 23A and 23B are placed in an X-axis direction in the drawings in order of the connection terminal 23A, the connection terminal 13A, the connection terminal 23B and the connection terminal 13B. However, the sections may be placed in different order. For example, as illustrated in FIGS. 42 to 44, the sections in contact with the anisotropic conductive films 58 and 71 of the connection terminals 13A, 13B, 23A and 23B may be placed in the X-axis direction in the drawings in order of the connection terminal 23A, the connection terminal 23B, the connection terminal 13A and the connection terminal 13B.

In the touch panel 4 according to the embodiment, a single-sided flexible substrate in which the wiring layers 52 are arranged in contact with only one surface of the base film 51 is used in the FPC 70. Moreover, the anisotropic conductive films 71 arranged on one surface of the base film 51 are electrically connected to two opening-non-opposed wiring layers 52 arranged on the one surface of the base film 51. On the other hand, the anisotropic conductive film 58 arranged on the other surface of the base film 51 is electrically connected to two opening-opposed wiring layers 52 arranged on the one surface of the base film 51 via the openings 51A arranged in the base film 51. Thus, in the embodiment, instead of arranging the wiring layer on both surfaces of the base film, or further arranging a through hole and through hole plating as in the case of related art, the openings 51A are arranged in the base film 51, so that the anisotropic conductive film 58 arranged on the other surface of the base film 51 is electrically connected to the wiring layers 52 arranged on the one surface of the base film 51. As a result, the thickness of the FPC 70 is reduced by the total thickness of one wiring layer and the through hole plating. Therefore, the FPC 70 with a smaller thickness than ever before is achieved. Moreover, the thickness of the FPC 70 is smaller by the thickness of the anisotropic conductive film 57 than the thickness of the FPC 60 according to the third embodiment.

Moreover, in the embodiment, as illustrated in FIG. 35, in the end section 70A of the FPC 70, the openings 61A and 62A of the adhesive layer 61 and the coverlay 62 are filled with the anisotropic conductive films 71. Thereby, the surfaces of the coverlay 62 and the anisotropic conductive films 71 are arranged in a single plane without a space, so the thicknesses in an alignment direction (a horizontal direction) of the four wiring layers 52 are uniform without a space in the FPC 70. As a result, compared to the case where a space is included in a flexible printed circuit in related art, crinkles or asperities on surfaces of the touch panel 4 caused by connection by compression bonding in a manufacturing step are reduced. Therefore, even if the whole upper surface of the transparent substrate 11 is used as a part of an enclosure of a device, the flatness of enclosure surfaces may not be impaired.

Fifth Embodiment

Figure 45:
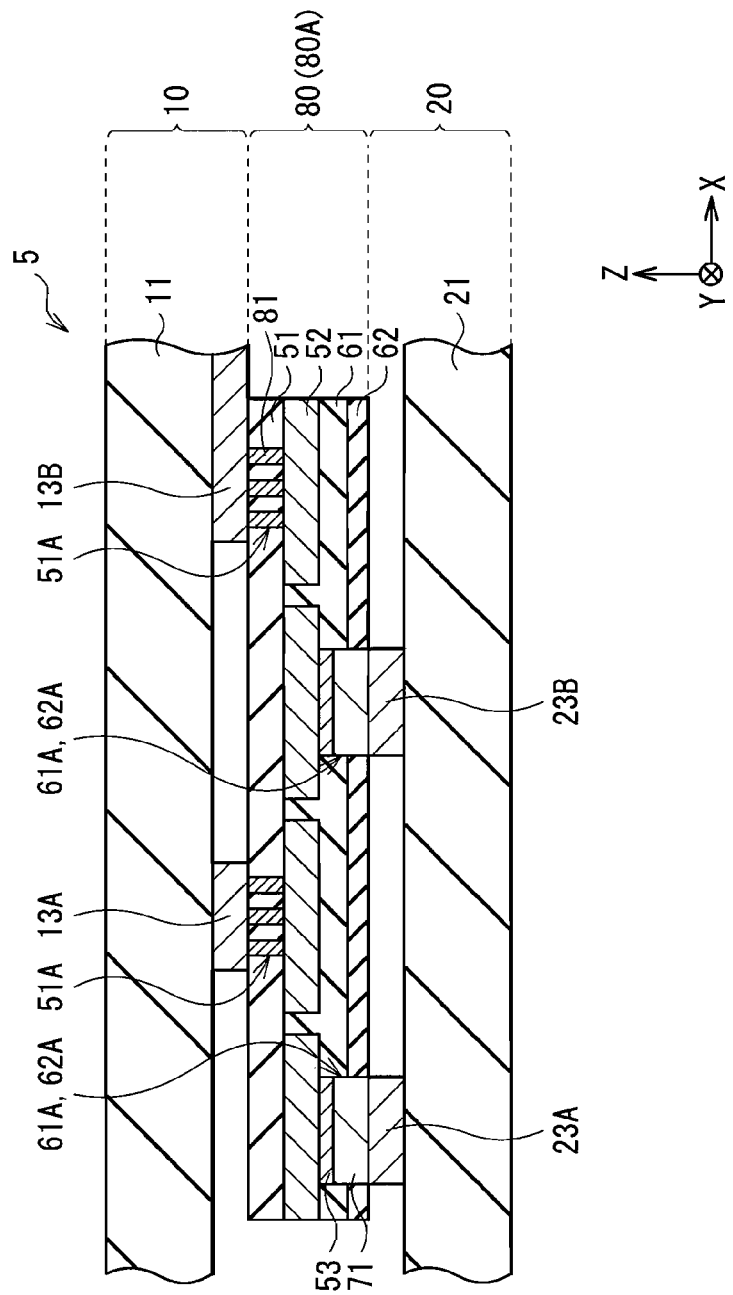
FIG. 45 is a sectional view of a touch panel according to a fifth embodiment of the invention.

FIG. 45 illustrates an example of a sectional configuration of a touch panel 5 according to a fifth embodiment of the invention. The touch panel 5 according to the embodiment is distinguished from the touch panel 4 according to the fourth embodiment by the fact that the touch panel 5 includes a flexible printed circuit (FPC) 80 instead of the FPC 70 in the fourth embodiment. Therefore, features different from the fourth embodiment will be mainly described below, and features common to the fourth embodiment will not be described.

Figure 46:
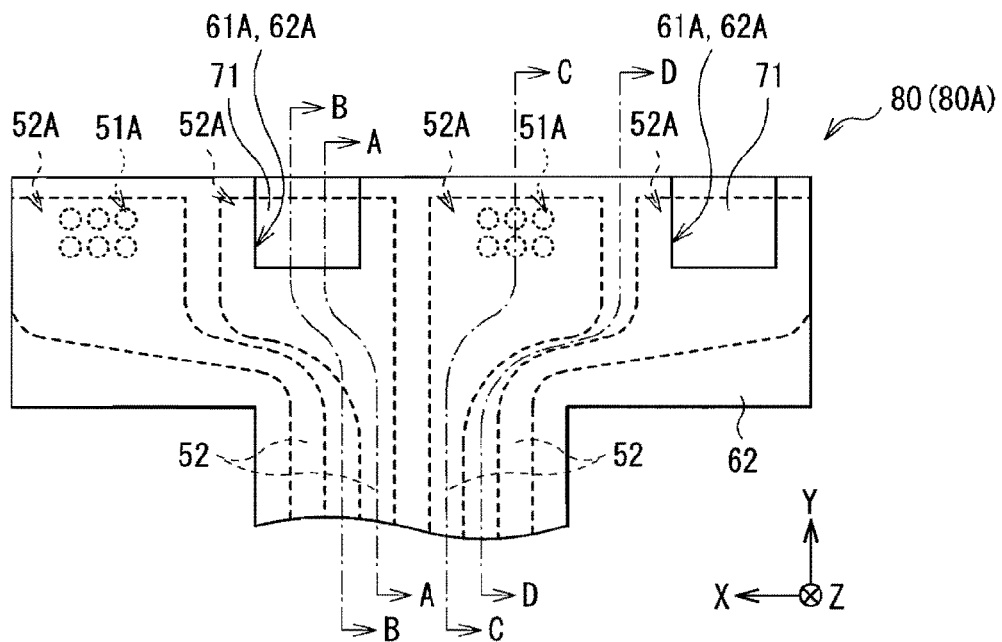
FIG. 46 is a plan view of one surface of one end section of an FPC in FIG. 45.
Figure 47:
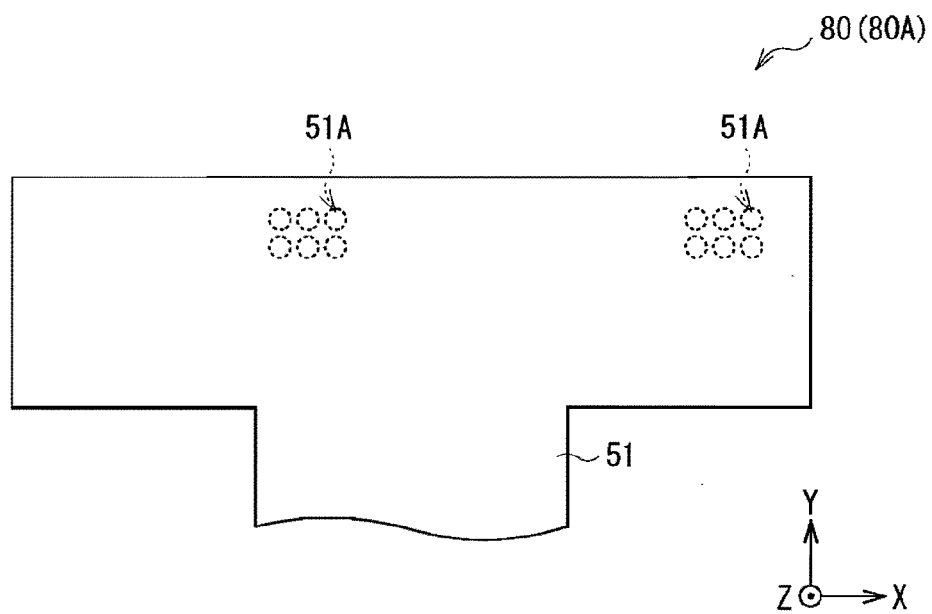
FIG. 47 is a plan view of the other surface of the one end section of the FPC in FIG. 45.
Figure 48:
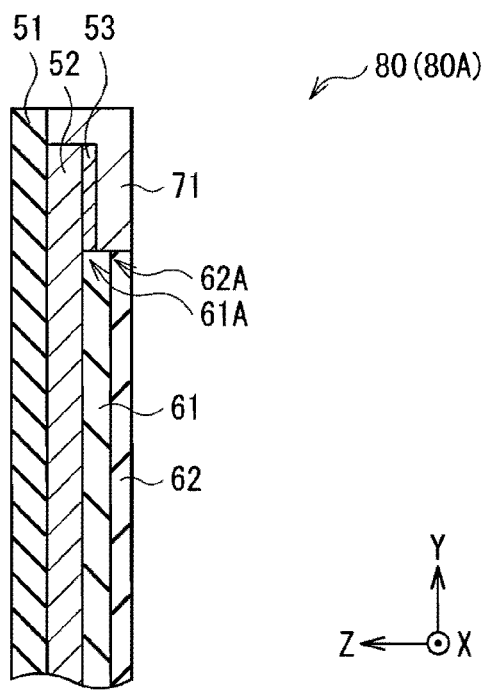
FIG. 48 is a sectional view of the FPC taken along line A-A in the direction of arrows in FIG. 46.
Figure 49:
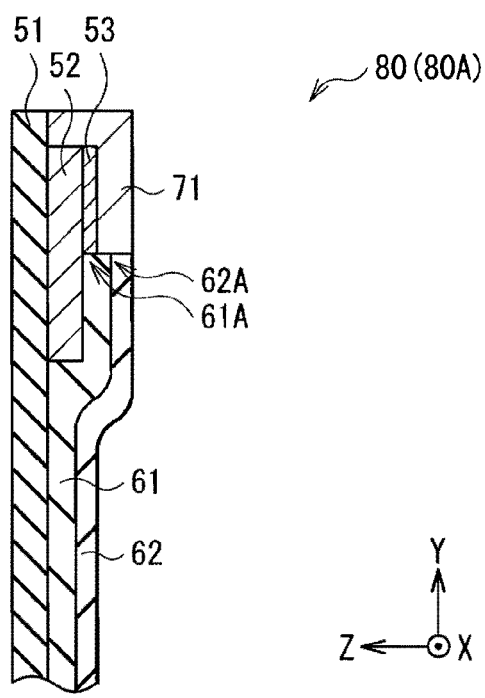
FIG. 49 is a sectional view of the FPC taken along line B-B in the direction of arrows in FIG. 46.
Figure 50:
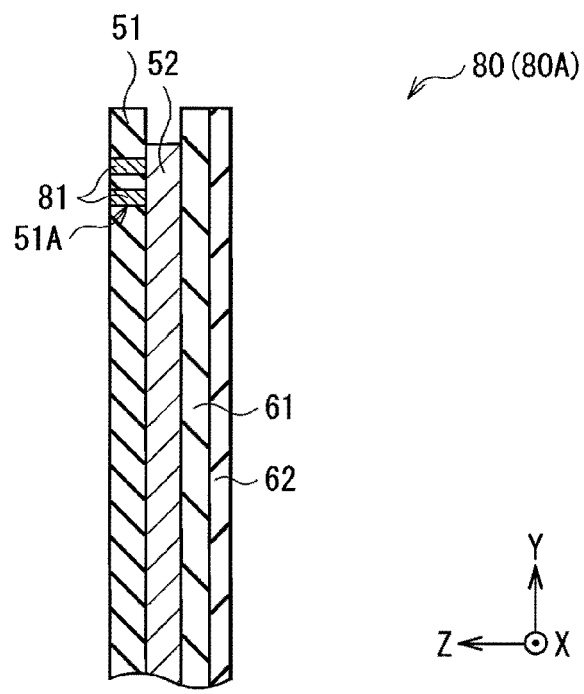
FIG. 50 is a sectional view of the FPC taken along line C-C in the direction of arrows in FIG. 46.
Figure 51:
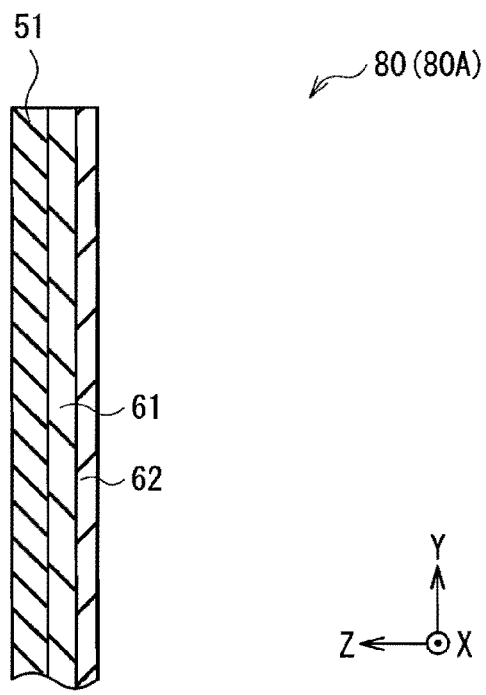
FIG. 51 is a sectional view of the FPC taken along line D-D in the direction of arrows in FIG. 46.

The sectional configuration illustrated in FIG. 45 corresponds to an end section 80A (a section corresponding to the end section 70A of the FPC 70) of the FPC 80 in the touch panel 5. FIG. 46 illustrates a surface view on a side close to the lower substrate 20 of the end section 80A, and FIG. 47 illustrates a surface view on a side close to the upper substrate 10 of the end section 80A. FIGS. 48, 49, 50 and 51 illustrate sectional views taken along lines A-A, B-B, C-C and D-D, respectively, in the direction of arrows in FIG. 46.

In the embodiment, instead of the anisotropic conductive film 58 in the fourth embodiment, plating layers 81 (second conductive members) are arranged. The plating layers 81 are formed in regions opposed to the opening-opposed wiring layers 52, and the openings 51A are filled with the plating layers 81. Therefore, the plating layers 81 are formed in a single plane where the base film 51 is formed, and are not formed on a surface of the base film 51.

The plating layers 81 are made of a plating material, and have adhesion and isotropic electrical conductivity. Thereby, the connection terminal 13A is electrically connected to the wiring layer 52 opposed to the connection terminal 13A via the plating layers 81, and the connection terminal 13B is electrically connected to the wiring layer 52 opposed to the connection terminal 13B via the plating layers 81.

Therefore, in the touch panel 5, the two connection terminals 13A and 13B coupled to the resistive film 12 on a side close to the transparent substrate 11 are electrically connected to the two opening-opposed wiring layers 52, respectively, via the openings 51A arranged in the base film 51. Moreover, the two connection terminals 23A and 23B coupled to the resistive film 22 on a side close to the transparent substrate 21 are electrically connected to the two opening-non-opposed wiring layers 52, respectively, not via the openings 51A arranged in the base film 51 but via the anisotropic conductive films 71 and the plating layers 53.

Figure 52:
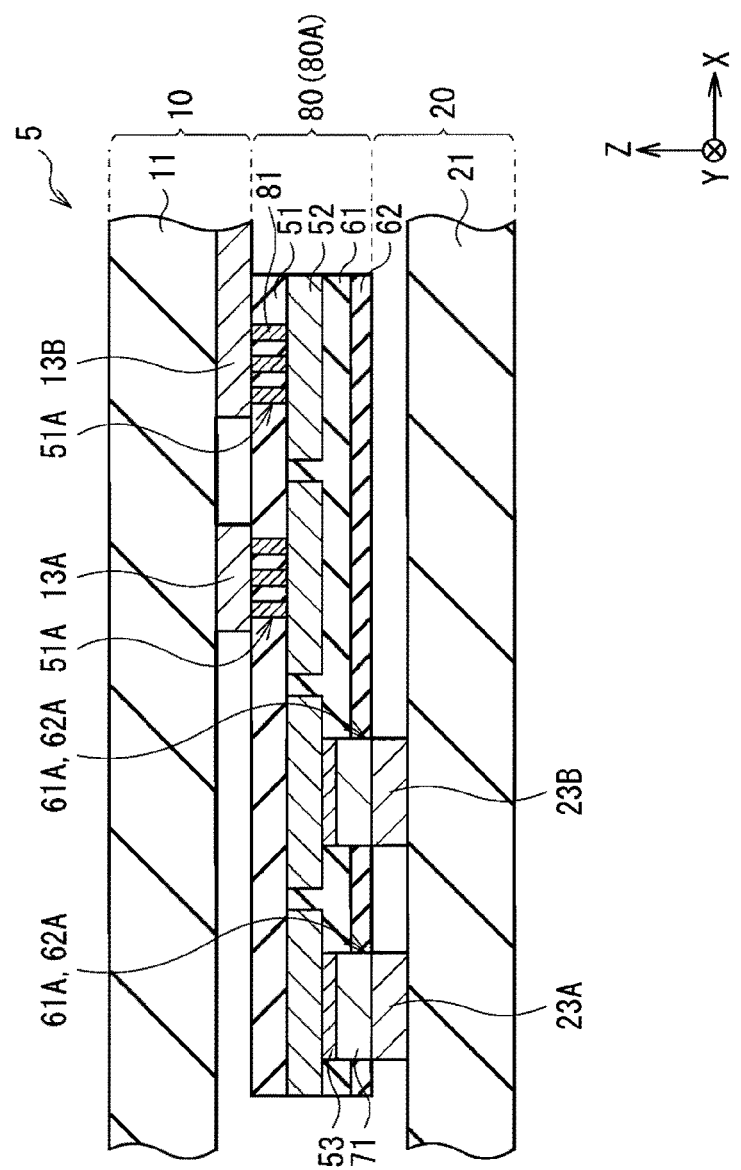
FIG. 52 is a sectional view of another configuration example of the touch panel in FIG. 45.
Figure 53:
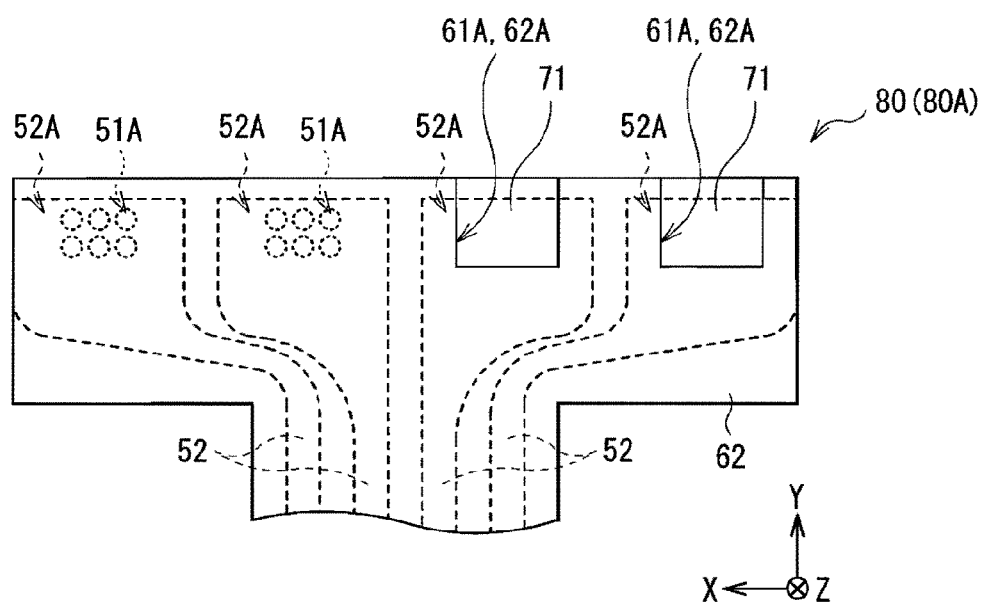
FIG. 53 is a plan view of one surface of one end section of an FPC in FIG. 52.
Figure 54:
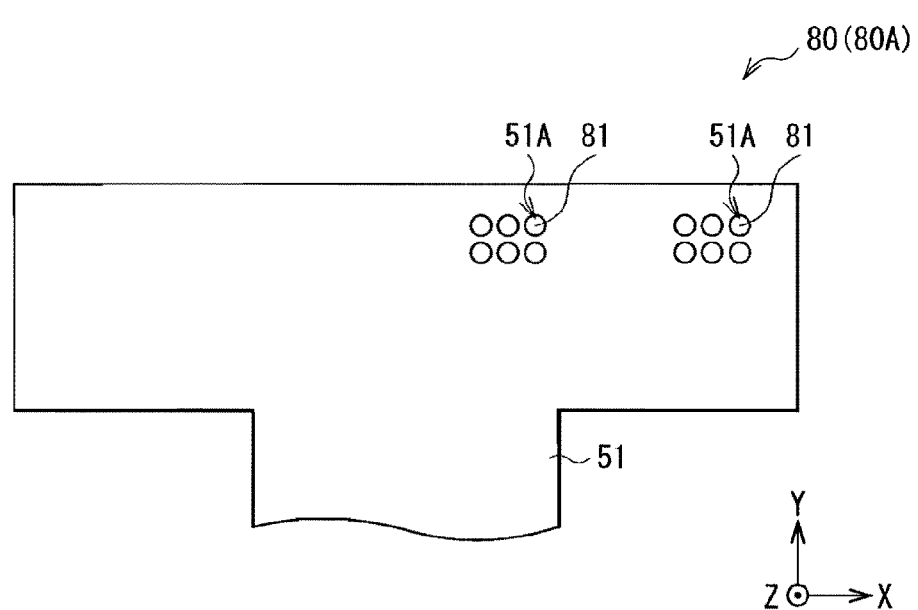
FIG. 54 is a plan view of the other surface of the one end section of the FPC in FIG. 52.

Moreover, in FIGS. 45 to 47, sections in contact with the anisotropic conductive films 71 and the plating layers 81 of the connection terminals 13A, 13B, 23A and 23B are placed in an X-axis direction in the drawings in order of the connection terminal 23A, the connection terminal 13A, the connection terminal 23B and the connection terminal 13B. However, the sections may be placed in different order. For example, as illustrated in FIGS. 52 to 54, the sections in contact with the anisotropic conductive films 71 and the plating layers 81 of the connection terminal 13A, 13B, 23A and 23B may be placed in the X-axis direction in the drawings in order of the connection terminal 23A, the connection terminal 23B, the connection terminal 13A and the connection terminal 13B.

In the touch panel 5 according to the embodiment, a single-sided flexible substrate in which the wiring layers 52 are arranged in contact with only one surface of the base film 51 is used in the FPC 80. Moreover, the anisotropic conductive films 71 arranged in one surface of the base film 51 is electrically connected to two opening-non-opposed wiring layers 52 arranged on the one surface of the base film 51. On the other hand, the plating layers 81 arranged on the other surface of the base film 51 are electrically connected to two opening-opposed wiring layers 52 arranged on the one surface of the base film 51 via the openings 51A arranged in the base film 51. Thus, in the embodiment, instead of arranging the wiring layers on both surfaces of the base film and further arranging a through hole and through hole plating as in the case of related art, the openings 51A are arranged in the base film 51, so that the plating layers 81 arranged on the other surface of the base film 51 are electrically connected to the wiring layers 52 arranged on the one surface of the base film 51. As a result, the thickness of the FPC 80 is reduced by the total thickness of one wiring layer and the through hole plating. Therefore, the FPC 80 with a smaller thickness than ever before is achieved. Further, the thickness of the FPC 80 is smaller by the thickness of the anisotropic conductive film 57 than the thickness of the FPC 60 according to the third embodiment, and is smaller by the thickness of the anisotropic conductive film 58 than the thickness of the FPC 70 according to the fourth embodiment.

Moreover, as illustrated in FIG. 45, in the end section 80A of the FPC 80, the openings 61A and 62A of the adhesive layer 61 and the coverlay 62 are filled with the anisotropic conductive films 71. Further, in the end section 80A of the FPC 80, the openings 51A of the base film 51 are filled with the plating layers 81. Thereby, the surfaces of the coverlay 62 and the anisotropic conductive films 71 are arranged in a single plane, and the surfaces of the base film 51 and the plating layers 81 are arranged in a single plane without a space, so the thicknesses in an alignment direction (a horizontal direction) of the four wiring layers 52 are uniform without a space in the FPC 80. As a result, compared to the case where a space is included in a flexible printed circuit in related art, crinkles or asperities on surfaces of the touch panel 5 caused by connection by compression bonding in a manufacturing step are reduced. Therefore, even if the whole upper surface of the transparent substrate 11 is used as a part of an enclosure of a device, the flatness of enclosure surfaces may not be impaired.

First Application Example

Figure 55:
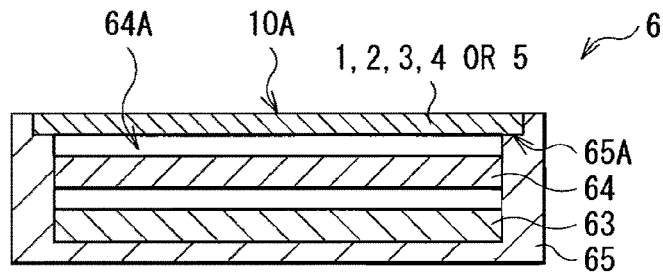
FIG. 55 is a sectional view of a display according to an application example.

FIG. 55 illustrates an application example in the case where any one of the touch panels 1, 2, 3, 4 and 5 according to the above-described embodiments is applied to a display. A display 6 in FIG. 55 includes a liquid crystal display panel 64 (a display panel) including an image display surface 64A, the touch panel 1, 2, 3 4 or 5 arranged on the image display surface 64A, a backlight 63 arranged on the back surface of the display panel 64 and an enclosure 65 supporting the liquid crystal display panel 64, the touch panel 1, 2, 3, 4 or 5 and the backlight 63. In the application example, any one of the touch panels 1, 2, 3, 4 and 5 according to the above-described embodiments is used, so as illustrated in FIG. 55, even in the case where the touch panel 1, 2, 3, 4 or 5 is fixed in a depression section 65A of the enclosure 65, and the whole contact surface 10A of the touch panel 1, 2, 3, 4 or 5 is used as a part of the enclosure 65, the contact surface 10A has few asperities, so the flatness of the enclosure surfaces may not be impaired.

Figure 56:
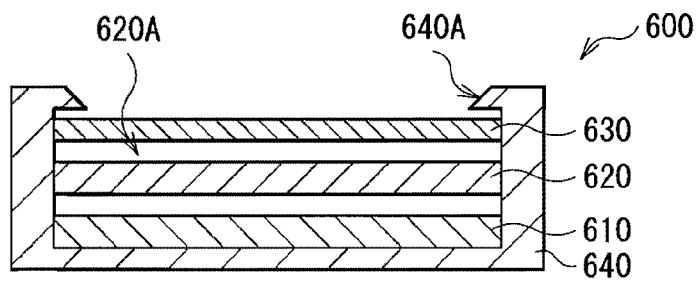
FIG. 56 is a sectional view of a display in related art.

In related art, as illustrated in a display 600 in FIG. 56, the perimeter of a touch panel 630 is pressed by a projection section 640A of an enclosure 640 supporting a display 620, a backlight 610 and the touch panel 630. Therefore, the thickness of the display 600 is larger by the thickness of the projection section 640A. To reduce the thickness of the display, when the touch panel 630 in related art is applied to the display 6 in FIG. 55, an outer edge of the touch panel 630 has asperities caused by an FPC (not illustrated), and the flatness of the enclosure surfaces is impaired.

On the other hand, in the application example, there are few asperities on the contact surface 10A, so as illustrated in FIG. 55, even if the whole contact surface 10A of the touch panel 1, 2, 3, 4 or 5 is used as a part of the enclosure 65, the flatness of the enclosure surfaces may not be impaired.

Second Application Example

Figure 57:
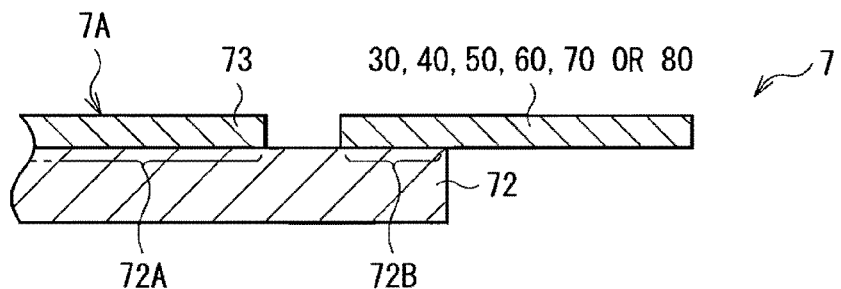
FIG. 57 is a sectional view of a liquid crystal display panel according to another application example.

Any one of the FPCs 30, 40, 50, 60, 70 and 80 according to the above-described embodiments is applicable as an FPC for signal input/output in a liquid crystal display panel. FIG. 57 illustrates an application example in the case where any one of the FPCs 30, 40, 50, 60, 70 and 80 according to the above-described embodiments is applied as an FPC for signal input/output in a liquid crystal display panel. A liquid crystal display panel 7 in FIG. 57 includes a pixel substrate 72, any one of the FPCs 30, 40, 50, 60, 70 and 80 according to the above-described embodiments, and a color filter 73. The pixel substrate 72 includes a pixel region 72A in which pixel circuits are formed in a matrix form, and a terminal region 72B in which connection terminals connected to the pixel circuits, respectively, are formed around the pixel region 72A, and the FPC 30, 40, 50, 60, 70 or 80 is electrically connected to the connection terminals in the terminal region 72B. A surface of the color filter 73 is an image display surface 7A.

Third Application Example

Figure 58:
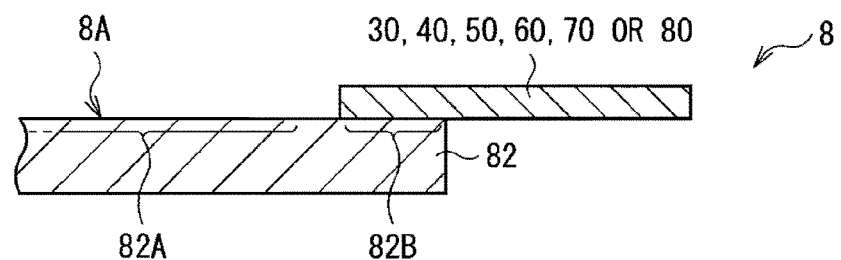
FIG. 58 is a sectional view of an organic EL panel according to still another application example.

Any one of the FPCs 30, 40, 50, 60, 70 and 80 according to the above-described embodiments is applicable as an FPC for signal input/output in an organic EL panel. FIG. 58 illustrates an application example in the case where any one of the FPCs 30, 40, 50, 60, 70 and 80 according to the above-described embodiments is applied as an FPC for signal input/putout in an organic EL panel. An organic EL panel 8 in FIG. 58 includes a pixel substrate 82 and any one of the FPCs 30, 40, 50, 60, 70 and 80 according to the above-described embodiments. The pixel substrate 82 includes a pixel region 82A in which pixel circuits are formed in a matrix form, and a terminal region 82B in which connection terminals connected to the pixel circuits, respectively, are formed around the pixel region 82A, and the FPC 30, 40, 50, 60, 70 or 80 is electrically connected to the connection terminals in the terminal region 82B. A surface of the pixel region 82A is an image display surface 8A.

Fourth Application Example

Figure 59:
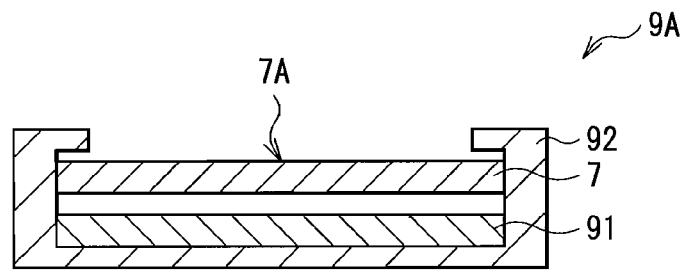
FIG. 59 is a sectional view of a display according to a further application example.

FIG. 59 illustrates an application example in the case where the liquid crystal display panel 7 according to the above-described application example is applied to a display. A display 9A in FIG. 59 includes the liquid crystal display panel 7 according to the above-described application example, a backlight 91 arranged behind the liquid crystal display panel 7, and an enclosure 92 supporting the liquid crystal display panel 7 and the backlight 91.

Fifth Application Example

Figure 60:
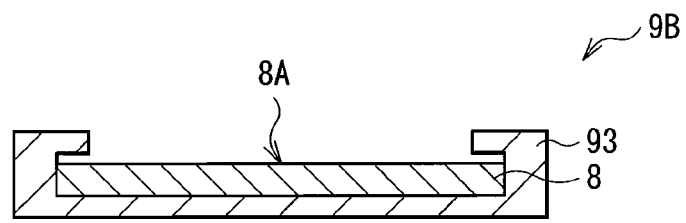
FIG. 60 is a sectional view of a display according to a still further application example.
Figure 61A:
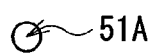
FIGS. 61A to 61E are sectional views illustrating various modifications of openings in a base film.
Figure 61B:
Figure 61C:
Figure 61D:
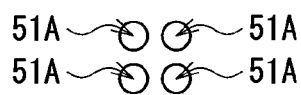
Figure 61E:
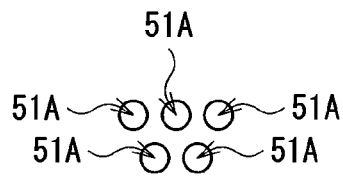
Figure 62:
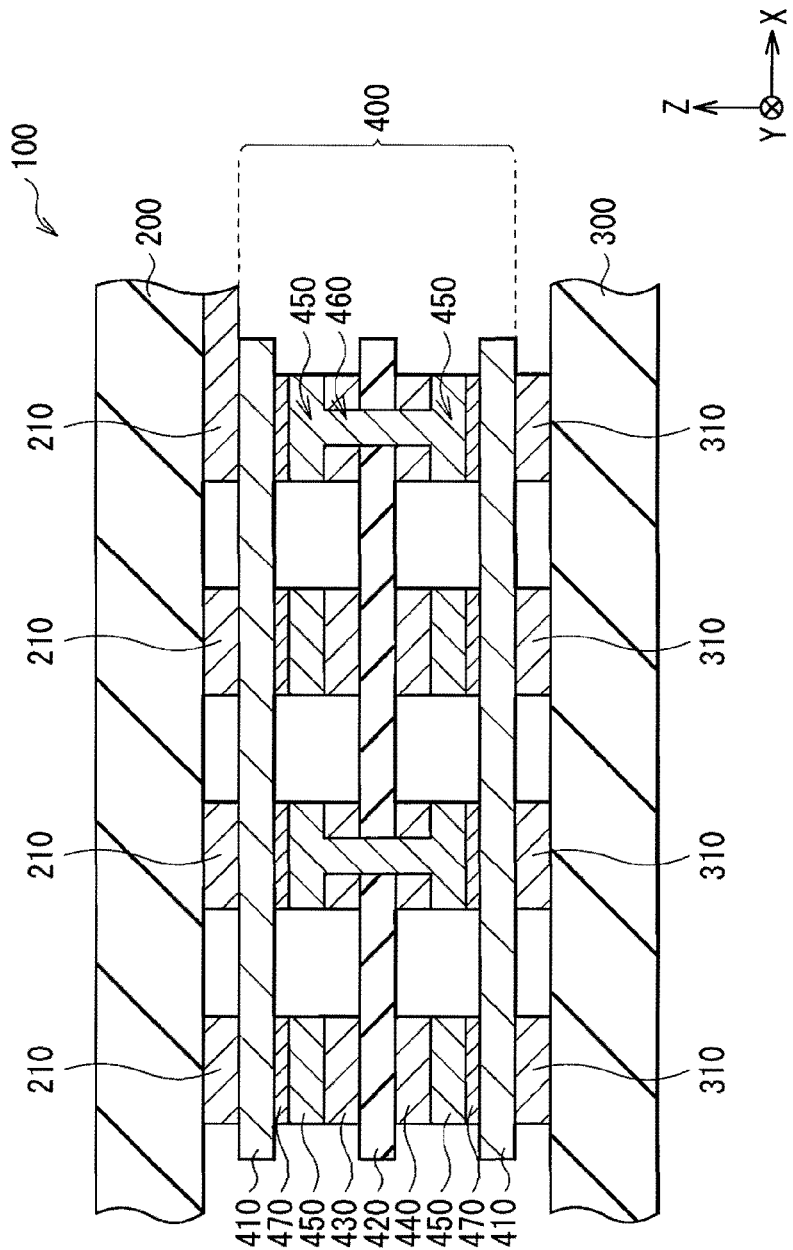
FIG. 62 is a sectional view of a touch panel in related art.
Figure 63:
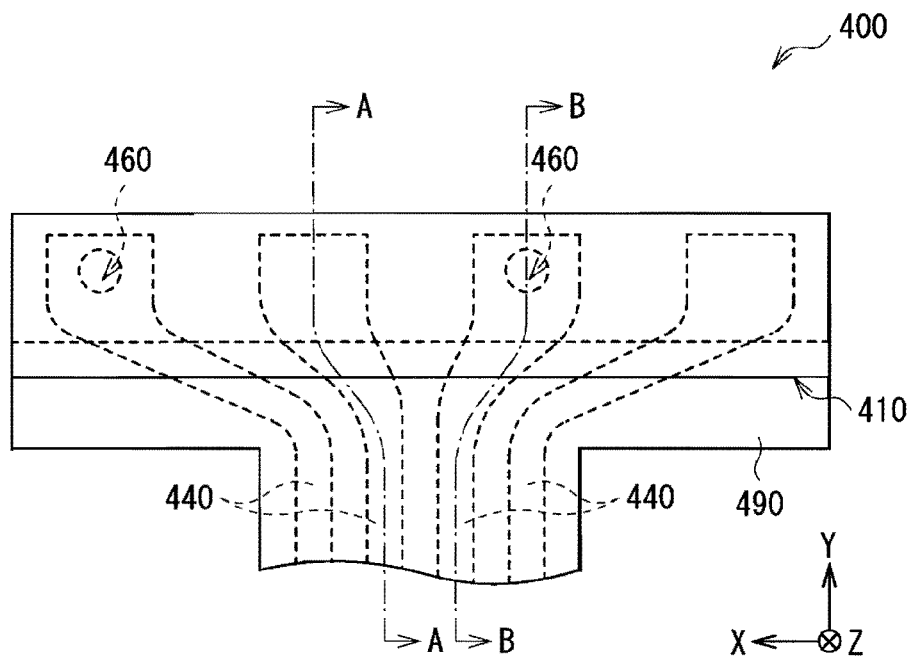
FIG. 63 is a plan view of one surface of one end section of an FPC in FIG. 62.
Figure 64:
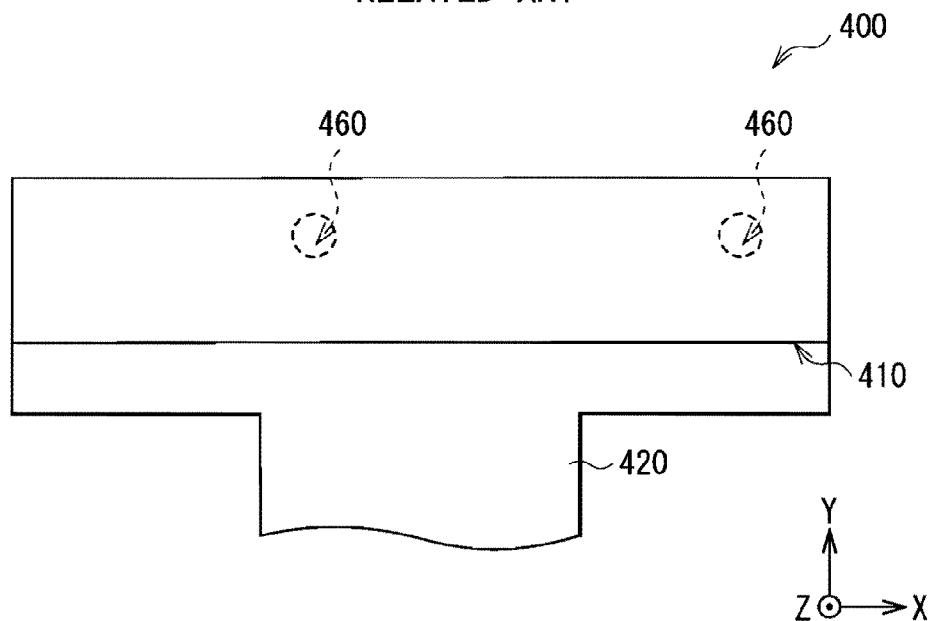
FIG. 64 is a plan view of the other surface of the one end section of the FPC in FIG. 62.
Figure 65:
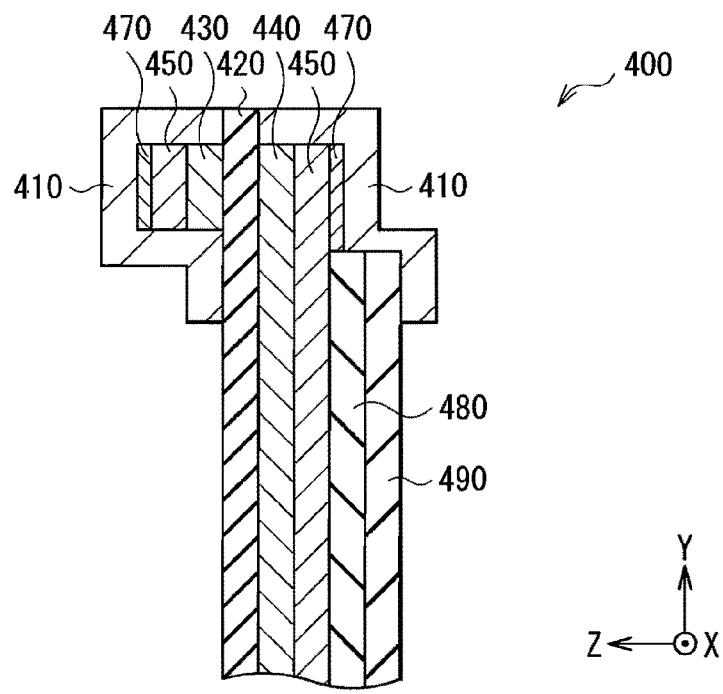
FIG. 65 is a sectional view of the FPC taken along line A-A in the direction of arrows in FIG. 63.
Figure 66:
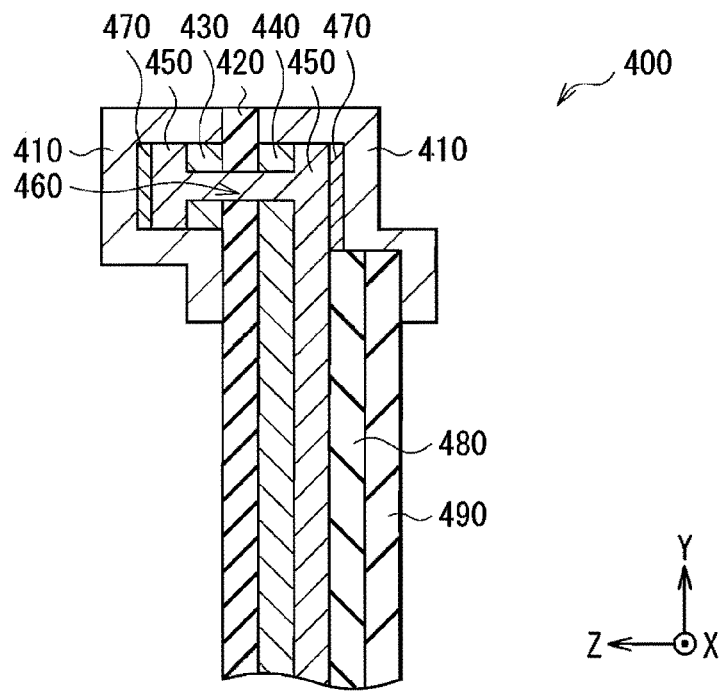
FIG. 66 is a sectional view of the FPC taken along line B-B in the direction of arrows in FIG. 63.

FIG. 60 illustrates an application example in the case where the organic EL panel 8 according to the above-described application example is applied to a display. A display 9B in FIG. 60 includes the organic EL panel 8 according to the above-described application example, and an enclosure 93 supporting the organic EL panel 8.

Although the present invention is described referring to the embodiments, and modifications and application examples of the embodiments, the invention is not limited thereto, and may be variously modified.

For example, in the above-described embodiments and the like, the number of openings 51A arranged in the base film 51 is 1 or 6. However, the number of openings 51A may be any other than 1 and 6. For example, as illustrated in FIGS. 61A to 61E, the number of openings 51A may be changed within a range of 1 to 5.

Moreover, in the above-described embodiments and the like, the opening 51A is arranged in the base film 51. However, a notch may be arranged instead of the opening 51A.

The present application contains subject matter related to that disclosed in Japanese Priority Patent Application JP 2008-159298 filed in the Japanese Patent Office on Jun. 18, 2008, the entire content of which are hereby incorporated by references.

It should be understood by those skilled in the art that various modifications, combinations, sub-combinations and alterations may occur depending on design requirements and other factors insofar as they are within the scope of the appended claims or the equivalents thereof.

What is claimed is:

1. A flexible printed circuit comprising:
   a flexible substrate including a first end section and a second end section, extending from the first end section to the second end section, and having an opening or a notch in proximity to the first end section;
   a first wiring layer being in contact with one surface of the flexible substrate, and extending from the first end section to the second end section so as to avoid the opening or the notch;
   a second wiring layer being in contact with the surface where the first wiring layer is in contact with the flexible substrate, and extending from the first end section to the second end section so as to block the opening or the notch;
   a first conductive member being formed opposed to the flexible substrate in relation to the first wiring layer and at least in proximity to the first end section in a region opposed to the first wiring layer, and being electrically connected to the first wiring layer; and
   a second conductive member being formed opposed to the first conductive member in relation to the flexible substrate and at least in proximity to the first end section in a region opposed to the second wiring layer, and being electrically connected to the second wiring layer via the opening or the notch.

2. The flexible printed circuit according to claim 1, wherein the opening or the notch is formed by irradiation with a laser beam or a cutting process.

3. The flexible printed circuit according to claim 1, further comprising:
   plating films between the first wiring layer and the first conductive member and between the second wiring layer and the second conductive member.

4. The flexible printed circuit according to claim 3, further comprising:
   a metal paste layer between the plating film arranged on a side close to the second conductive member of the second wiring layer and the second conductive member.

5. The flexible printed circuit according to claim 1, wherein the first conductive member and the second conductive member both are made of anisotropic conductive films having electrical conductivity in a thickness direction and insulation in a direction orthogonal to the thickness.

6. The flexible printed circuit according to claim 1, further comprising:
   an insulating layer between the flexible substrate and the first conductive member and in a space between the first wiring layer and the second wiring layer.

7. The flexible printed circuit according to claim 1, wherein the first conductive member is formed in a region opposed to the first wiring layer, and
   an insulating layer is included in a single plane where the first conductive member is arranged and at least in a region opposed to the second wiring layer.

* * * * *